US010029456B2

(12) United States Patent
Nakagawa et al.

(10) Patent No.: US 10,029,456 B2
(45) Date of Patent: Jul. 24, 2018

(54) DROPLET POSITIONING METHOD, PATTERN FORMING METHOD, DROPLET POSITIONING PROGRAM, DROPLET POSITIONING DEVICE, AND TEMPLATE PATTERN DESIGN METHOD

(71) Applicant: Toshiba Memory Corporation, Tokyo (JP)

(72) Inventors: Yasutada Nakagawa, Kanagawa-ken (JP); Satoshi Tanaka, Kanagawa-ken (JP); Yoko Takekawa, Miyagi-ken (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 630 days.

(21) Appl. No.: 13/832,570

(22) Filed: Mar. 15, 2013

(65) Prior Publication Data

US 2013/0249981 A1    Sep. 26, 2013

(30) Foreign Application Priority Data

Mar. 23, 2012 (JP) .................. 2012-068474

(51) Int. Cl.
*B41J 2/45* (2006.01)
*B41J 2/045* (2006.01)
(Continued)

(52) U.S. Cl.
CPC ......... *B41J 2/04501* (2013.01); *B29C 43/021* (2013.01); *G03F 7/0002* (2013.01); *B82Y 10/00* (2013.01); *B82Y 40/00* (2013.01)

(58) Field of Classification Search
CPC .. B29C 43/021; B41J 2/04501; G03F 7/0002; B82Y 10/00; B82Y 40/00
(Continued)

(56) References Cited

U.S. PATENT DOCUMENTS 7,854,604 B2    12/2010 Yoneda et al.
8,691,123 B2 *  4/2014 Nakagawa ............... G03F 7/16
                                                      264/40.1
(Continued)

FOREIGN PATENT DOCUMENTS

CN    1701942 A    11/2005
CN    1732075 A    2/2006
(Continued)

OTHER PUBLICATIONS

Office Action dated Feb. 10, 2014 in Korean Patent Application No. 10-2013-0026597 with English language translation.
(Continued)

*Primary Examiner* — Robert J Grun
(74) *Attorney, Agent, or Firm* — Oblon, McClelland, Maier & Neustadt, L.L.P.

(57) ABSTRACT

In general, according to one embodiment, a method is disclosed for a droplet positioning method.
The method can include determining an amount of the droplet required in each of a first region, determining a total amount of the droplet, determining a total number of the droplets, determining a provisional positioning of the droplets based on a template contact form, redividing the face for forming the base body pattern again using the second regions, and determining an evaluation value for each second region. If the distribution of the evaluation values is out of the target range, a repositioning at least any of the droplets, redividing the face for forming the base body pattern again using the second regions, and determining an evaluation value for each second region are repeated until distribution of the evaluation values is in the target range.

13 Claims, 15 Drawing Sheets

(51) Int. Cl.
  *B29C 43/02*   (2006.01)
  *G03F 7/00*    (2006.01)
  *B82Y 40/00*   (2011.01)
  *B82Y 10/00*   (2011.01)

(58) Field of Classification Search
  USPC ...... 264/40.1, 40.4, 406; 425/135, 140, 145, 425/375
  See application file for complete search history.

(56) References Cited

U.S. PATENT DOCUMENTS

| | | |
|---|---|---|
| 2006/0266734 A1 | 11/2006 | Fujii et al. |
| 2009/0014917 A1 | 1/2009 | Hodge et al. |
| 2009/0115110 A1 | 5/2009 | Schumaker |
| 2010/0097590 A1 | 4/2010 | Schumaker |
| 2012/0074605 A1 | 3/2012 | Nakagawa et al. |

FOREIGN PATENT DOCUMENTS

| | | |
|---|---|---|
| CN | 101636256 A | 1/2010 |
| JP | 2007-320098 | 12/2007 |
| JP | 2010-240928 | 10/2010 |
| JP | 2011-181829 A | 9/2011 |
| JP | 2012-69818 | 4/2012 |

OTHER PUBLICATIONS

U.S. Appl. No. 13/204,844, filed Aug. 8, 2011, 2012/0074605 A1, Yasutada Nakagawa et al.

Office Action dated Nov. 2, 2015 in Chinese Patent Application No. 201310087116.9 (with English translation).

Combined Chinese Office Action and Search Report dated Feb. 3, 2015 in Patent Application No. 201310087116.9 (with English language translation).

* cited by examiner

DROPLET POSITIONING METHOD, PATTERN FORMING METHOD, DROPLET POSITIONING PROGRAM, DROPLET POSITIONING DEVICE, AND TEMPLATE PATTERN DESIGN METHOD

CROSS-REFERENCE TO RELATED APPLICATIONS

This application is based upon and claims the benefit of priority from the prior Japanese Patent Application No. 2012-068474, filed on Mar. 23, 2012; the entire contents of which are incorporated herein by reference.

FIELD

Embodiments described herein relate generally to a droplet positioning method, a pattern forming method, a droplet positioning program, a droplet positioning device, and a template pattern design method.

BACKGROUND

Imprint methods are techniques by which a template (also called a stamper, mold, or forma) is pressed onto a transfer subject body, and a pattern formed on the template is transferred to the transfer subject body.

For such imprint methods, techniques have been proposed whereby fluidity of a resin that forms the transfer subject body is improved by using a template including protrusions.

However, conventionally, the density of patterns formed on the template is non-uniform. Hence, even when a template that simply includes protrusions is used, there is a risk that local excess and deficiency of the amount of the transfer subject body will occur, causing a deterioration in transcription.

DETAILED DESCRIPTION

Figure 1:
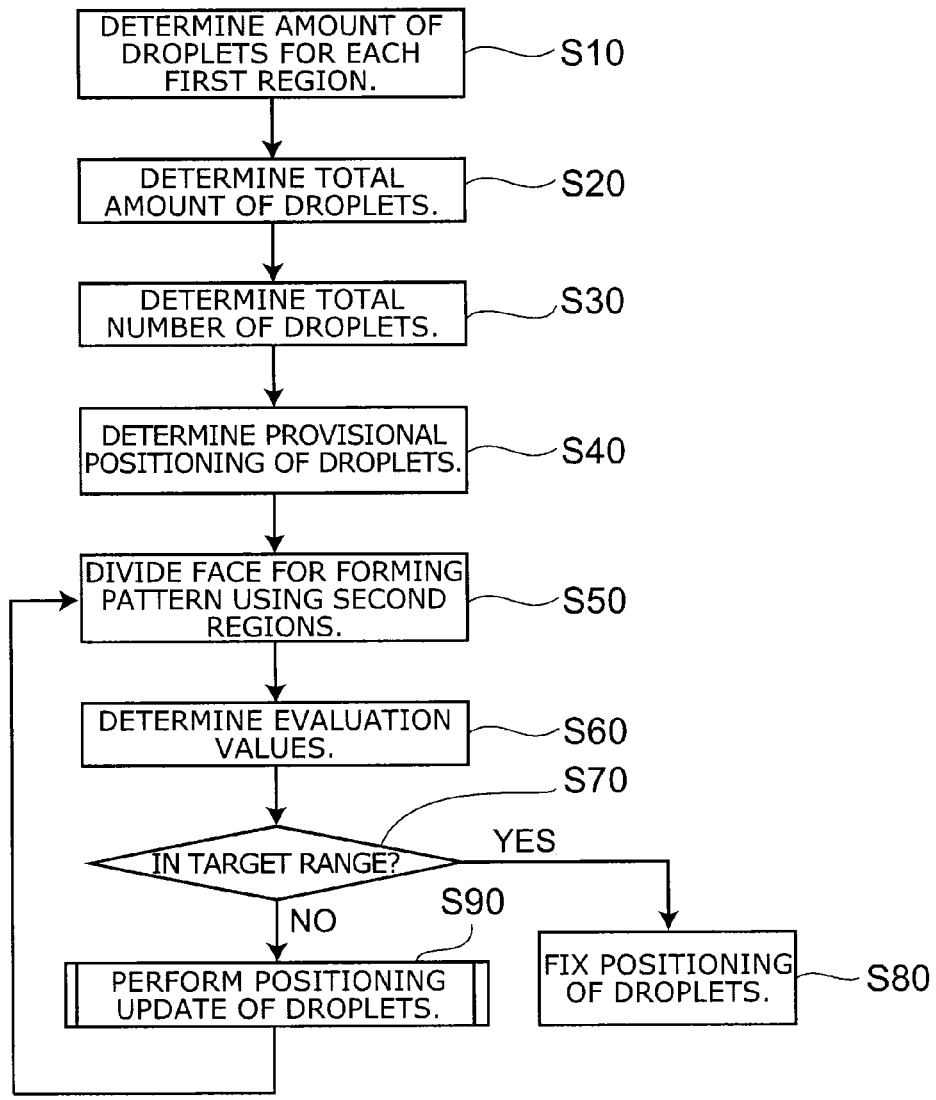
FIG. 1 is a flowchart illustrating a droplet positioning method according to a first embodiment.

In general, according to one embodiment, a method is disclosed for a droplet positioning method for positioning a plurality of droplets on a face for forming a base body pattern, when transferring a pattern formed on a template. The method can include dividing the face for forming the base body pattern into a plurality of first regions, each having an area smaller than an area occupied by one droplet, to determine an amount of the droplet required in each of the first region. The method can include adding the amount of the droplet in each of the first region to determine a total amount of the droplet required for the entire face for forming the base body pattern. The method can include dividing the total amount of the droplet by the amount of the droplet to determine a total number of the droplets to be disposed on the face for forming the base body pattern. The method can include determining a provisional positioning of the droplets on the face for forming the base body pattern based on a template contact form. The method can include assigning each of the first region to most proximate droplets and grouping the first regions assigned to the most proximate droplets as second regions to redivide the face for forming the base body pattern again using the second regions. The method can include dividing an amount of one of the droplets by the amount of the droplet required in each of the first region belonging to the second region to determine an evaluation value for each second region. If a distribution of the evaluation values for the face for forming the base body pattern is in a target range, positions of all the droplets are fixed. If the distribution of the evaluation values for the face for forming the base body pattern is out of the target range, a repositioning at least any of the droplets, the assigning each of the first region to most proximate droplets and grouping the first regions assigned to the most proximate droplets as second regions to redivide the face for forming the base body pattern again using the second regions, and the dividing an amount of one of the droplets by the amount of the droplet required in each of the first region belonging to the second region to determine an evaluation value for each second region are repeated until distribution of the evaluation values is in the target range.

Embodiments will now be described with reference to the drawings. Note that the same numerals are applied to similar constituent elements in the drawings and detailed descriptions of such constituent elements are appropriately omitted.

First Embodiment

FIG. 1 is a flowchart illustrating a droplet positioning method according to a first embodiment. The droplet positioning method according to this embodiment is a method for positioning a plurality of droplets two dimensionally on a face for forming a base body pattern in transferring a pattern formed on a template. In this embodiment, a wafer for a semiconductor, a glass substrate, or the like is, for example, used as the base body. For the plurality of droplets to be disposed on the face for forming a pattern, so-called resist drop bodies are, for example, used. As a material for the resist drop bodies, a light (UV light or the like) curing resin may be used. Then, for example, a position of each droplet is determined using the droplet positioning method according to this embodiment and, based on the determined position of the droplets, the droplets are disposed two dimensionally on the base body that is a base material. Next, the template is pressed onto the plurality of disposed droplets and the pattern formed on the template is transferred to the transfer subject body formed from the droplets.

FIG. 1 illustrates an overview of the droplet positioning method according to this embodiment. The details of each step are described below.

First, a face for forming a base body pattern is divided into a plurality of first regions, each having an area smaller than an area occupied by one droplet, to determine an amount (volume) of the droplet required in each of the first regions (step S10).

The density of the pattern to be formed is not always uniform. Hence, the density of the pattern in each first region that is a micro-region is determined and the determined density of the pattern and other data, which is described below, are used to determine the amount of the droplet. Thus, the coarseness and fineness of the pattern can be supported by determining the density of the pattern for each of the first regions.

The first region may be, for example, a region of approximately 5 μm×5 μm.

Next, the amounts of the droplet in the first regions are added to determine a total amount of the droplet required over the entire face for forming the pattern (step S20).

Next, the total amount of the droplet is divided by the amount of the droplet to determine a total number of droplets to be disposed on the face for forming the pattern (step S30).

Next, a provisional positioning of the droplet on the face for forming the base body pattern is determined (step S40).

A provisional positioning of the droplet is determined, taking into consideration a contact form of when assuming that the template contacts the face for forming the pattern (hereinafter referred to simply as "template contact form"). In other words, the provisional positioning of the droplet on the face for forming the base body pattern is determined according to the template contact form (point contact, line contact and surface contact).

Here, it is possible to select and control the template contact form by intentionally deforming the template. For example, by pressing a face on a side opposite the side where the pattern of the template is formed to cause the template to protrude toward the base body side (for example, the template may be caused to protrude in conical form), the template contact form can be selected and controlled.

A pattern forming technique exists whereby a photosensitive resin material is applied to a circular base body and, to form the pattern, the template is aligned with a center of the base body and the protruding portion of the template is pressed onto the resin. One example of such a fine pattern forming technique is described in Japanese Unexamined Patent Application Publication No. 2010-240928 cited as Patent Document 1 above.

In the following, an initial provisional positioning of the droplet is referred as an "initial positioning" of the droplet.

Next, the first regions are assigned to the most proximate droplets, and the first regions assigned to the most proximate droplets (i.e. a collection of first regions) are grouped as second regions. Then, the face for forming the pattern is redivided using the second regions (step S50).

Next, for each second region, a value (evaluation value) is determined by dividing an amount of a single droplet by the total amount of the required droplets determined for each of the first regions belonging to the second region (step S60).

The determination of this value resulting from the division (evaluation value) is performed for each second region.

In the following, the value resulting from the division is referred to as the "evaluation value".

Here, if the evaluation value is "1", it is understood that the amount of the droplet in the second region being evaluated is optimal. Thus, it can be evaluated that the positioning for the droplets is optimal.

If the evaluation value is larger than "1", it is understood that the amount of the droplet in the second region being evaluated is excessive.

If the evaluation value is less than "1", it is understood that the amount of the droplet in the second region being evaluated is too small.

Here, for the second region where the amount of the droplet is insufficient, there is a risk that portions in the recesses of the pattern of the template will not be filled and that a thickness measurement of a later-described residual film will be too thin. Conversely, for the second region where the amount of the droplet is excessive, there is a risk that the thickness measurement of the later-described residual film will be too thick.

Next, whether or not a distribution of the evaluation values on the face for forming the pattern is in a target range is determined (step S70).

Specifically, for each second region, whether the amount of the droplet is insufficient or excessive is determined.

In the following, this determination is referred to as a "danger point (hot spot) evaluation".

Here, for example, a difference between the maximum and minimum evaluation values, a maximum value of the absolute value of the difference between the evaluation value and "1", a standard deviation or the like may be used as an indicator of whether or not the distribution of the evaluation values is in the target range.

Next, when the distribution of the evaluation values on the face for forming the pattern is in the target range, the positions of all the droplets are fixed (step S80).

When the distribution of the evaluation values on the face for forming the pattern is out of the target range, a repositioning at least any of the droplets, the dividing the face for forming the pattern (step S50), and the determining an evaluation value (step S60) is repeated (step S90) until the distribution of the evaluation values is in the target range.

Note that in the following, the above-described repositioning is described as a "positioning update" of the droplets.

In the positioning update, the position of at least any one of the droplets is changed.

The routine of step S50, step S60, step S70 and Step S90 in that order is then repeated until the distribution of the evaluation values is in the target range.

In the routine, the total amount of the droplet between the face for forming the pattern and the template remains unchanged. In other words, in the routine, only the position of the droplet is changed.

When the distribution of the evaluation values on the face for forming the pattern is in the target range, the positions of all the droplets are fixed (Step S80).

According to such a process, an appropriate position of each of the droplets on the face for forming the pattern can be determined.

Then, based on the determined position of each of the droplets, the droplets are disposed two dimensionally on the base body using an inkjet method or the like. The template is then pressed onto the plurality of disposed droplets to transfer the pattern formed on the template to the transfer subject body formed from the droplets.

As a result, the generation of local excess and deficiency of the amount of the droplets on the face for forming the pattern can be suppressed. Hence, transcription can be improved.

Next, details of the above-described steps will be described.

First, an example is given of a procedure to determine the required total amount of the droplet in the above-described Step S20.

Figure 2:
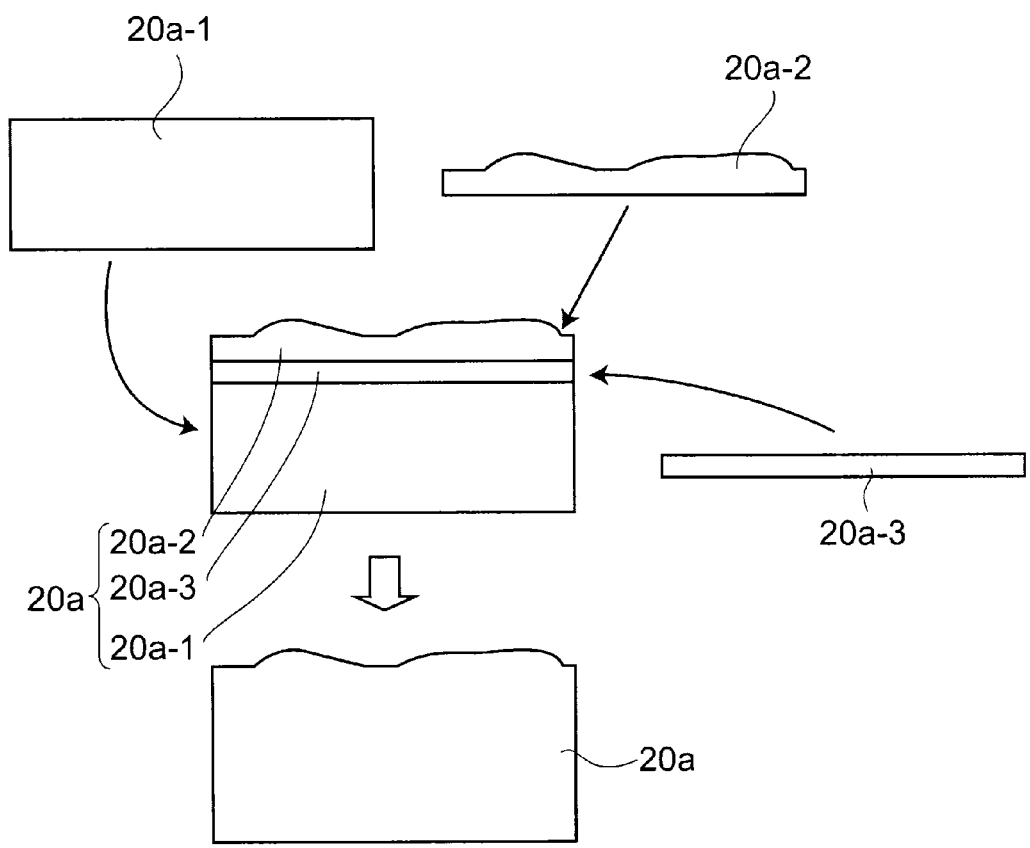
FIG. 2 is a block diagram illustrating the procedure for determining a total amount of the droplet.

FIG. 2 is a block diagram illustrating the procedure for determining a total amount of the droplet.

In FIG. 2, a length in a horizontal direction of each block representing an amount of the droplet corresponds to a length in a longitudinal direction of the face for forming the pattern.

Block 20a-1 represents a total amount of the droplet determined from first input data and second input data.

The first input data may, for example, be a height measurement of the pattern formed on the template, or a later-described thickness measurement of a residual film. Specifically, the first input data may, for example, be data extracted from design data or the like for the pattern formed on the template. The second input data may, for example, be a density distribution of the pattern formed on the template, a coverage factor distribution of the pattern, or the like.

Block 20a-2 represents a correction amount of the amount of the droplet determined from third input data.

The third input data may, for example, be data relating to in-face correction of an amount of the droplet on the face for forming the pattern. The data relating to in-face correction may, for example, be a size of a step provided in the face for forming the pattern, a surface state of the face for forming the pattern, a volatilization volume distribution of the droplet, or the like.

Block 20a-3 represents a correction amount of the amount of the droplet determined from fourth input data.

The fourth input data may, for example, be data relating to a correction value for the amount of the droplet, the correction value resulting from nozzle characteristics and individual differences in the inkjet device or other dispensing device, and the like.

Then, based on the amounts of the droplet determined from the first input data and the second input data (for example, the data relating to the pattern dimensions extracted from the design data for the pattern and the data relating to the density distribution of the pattern or the coverage factor distribution of the pattern extracted from the design data for the pattern) and the correction value for the amounts of the droplet determined from the third input data and the fourth input data (for example, at least any of the data relating to in-face correction of the amount of the droplet on the face for forming the base body pattern and data relating to the correction of the amount of the droplet due to the dispensing device), a total amount of the droplet required for the entire face for forming the pattern is determined.

The block 20a represents a total amount of the droplet required for the entire face for forming the pattern. In other words, by adding the amount of the droplet (block 20a-1) determined from the first input data and the second input data, the correction amount (block 20a-2) of the amount of the droplet determined from the third input data, and the correction amount (block 20a-3) of the amount of the droplet determined from the fourth input data, the total amount of the droplet (block 20a) required for the entire face for forming the pattern can be determined.

Note that the correction amount (block 20a-2) of the amount of the droplet determined from the third input data and the correction amount of the amount of the droplet determined from the fourth input data are not necessarily required and may be used as necessary.

In the following, the second input data is described in more detail.

Whether the density of the pattern is high or low can be determined according to whether the coverage factor of the pattern is high or low. The coverage factor of the pattern is a ratio of the coverage of the face for forming the pattern by the formed transfer subject body per unit area of the face for forming the pattern.

In this case, as the second input data, the density distribution of the pattern formed on the template may be selected. This is because the density distribution of the pattern formed on the face for forming the pattern and the density distribution of the pattern formed on the template are substantially the same.

In the following, as an example, the density distribution of the pattern formed on the template is described.

Figure 3A:
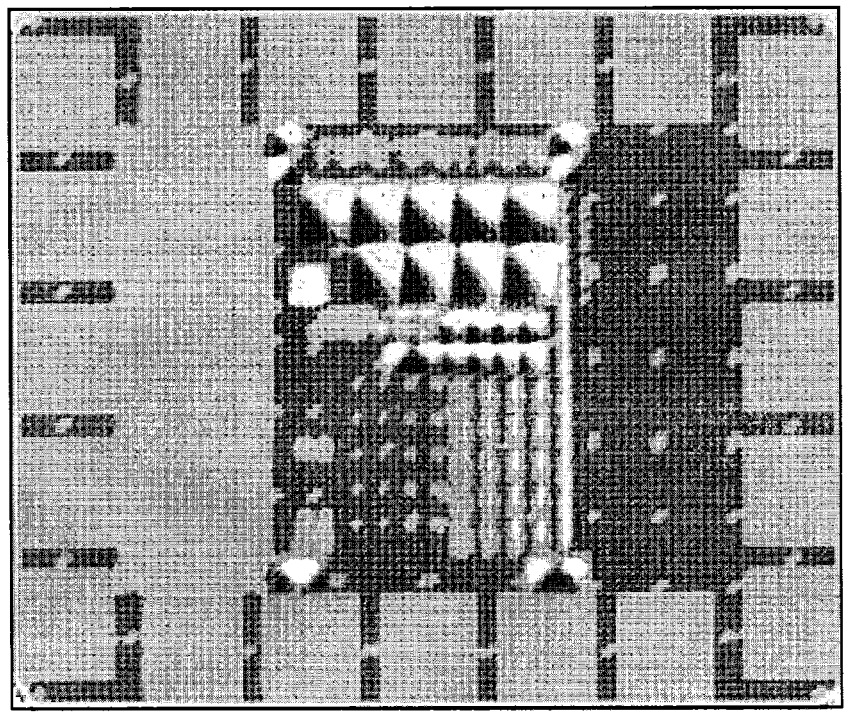
FIG. 3A is a schematic view illustrating a state of a density distribution of the pattern formed on the template.
Figure 3B:
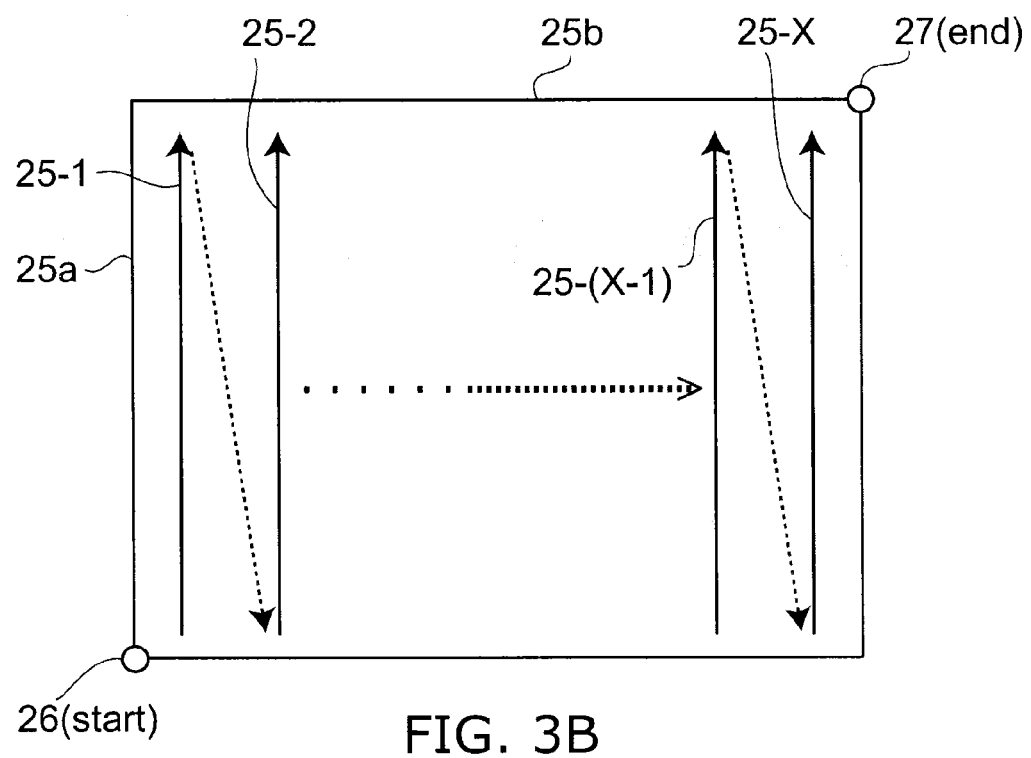
FIG. 3B is a view conceptually illustrating a determination procedure for the density distribution of the pattern.

FIGS. 3A and 3B are schematic views illustrating the determination of the density distribution of the pattern formed on the template.

FIG. 3A is a schematic view illustrating a state of a density distribution of the pattern formed on the template. In FIG. 3A, the darker a portion is shaded, the higher the density of the pattern (i.e. the pattern is more tightly disposed). Conversely, the lighter a portion is shaded, the lower the density of the pattern (i.e. the pattern is less tightly disposed).

FIG. 3B is a view conceptually illustrating a determination procedure for the density distribution of the pattern.

As illustrated in FIG. 3A, the pattern formed on the template has a density distribution. Specifically, the tighter recesses and protrusions are formed in the pattern, the higher the density of the pattern.

When the pattern has a density distribution, the density distribution of the pattern can be determined using, for example, a procedure as illustrated in FIG. 3B.

To determine the density distribution of the pattern, the face for forming the pattern is divided into the above-described first regions and the density of the pattern for each first region is determined. Here, it may be the case that there is a density distribution of the pattern within one or more of the first regions. Hence, to determine the density distribution of the pattern, an average value for the density of the pattern in each first region is determined, and the determined average value is used as the density of the pattern in the relevant first region.

First, the density of the pattern is determined for each first region along a first line 25-1 parallel to an edge 25a, moving from a determination start point 26 side toward an edge 25b on a side opposing the start point 26.

Next, the density of the pattern is determined for each first region along a second line 25-2 adjacent to the first line 25-1, moving from the start point 26 side toward the edge 25b on the side opposing the start point 26. Such determinations are executed until the end point 27 side of the Xth line 25-X is reached.

In this way, the density distribution (or coverage factor distribution) of the pattern formed on the template can be determined.

Note that while FIG. 3B is a view that conceptually illustrates a determination procedure for the density distribution of the pattern, the density distribution of the pattern is not necessarily determined with a scan-type procedure. For example, data on the recesses and protrusions in the pattern to be formed on the template and data on the positions where the recesses and protrusions are formed may be extracted from design data or the like, and the density distribution of the pattern may be determined based on the extracted data.

Next, the third input data is described in more detail.

As described above, the third input data may, for example, be a size of a step provided in the face for forming the pattern, the surface state of the face for forming the pattern, the volatilization volume distribution of the droplet, or the like. Of these, the size of a step provided in the face for forming the pattern and the surface state of the face for forming the pattern can be extracted from the base body specifications, design data, or the like.

The volatilization volume distribution of the droplet can be determined by performing an experiment or a simulation.

Next, the fourth input data is described in more detail.

As described above, the fourth input data may, for example, be data relating to a correction value for the amount of the droplet, the correction value resulting from the nozzle characteristics and individual differences in the inkjet device or other dispensing device, and the like.

Figure 4:
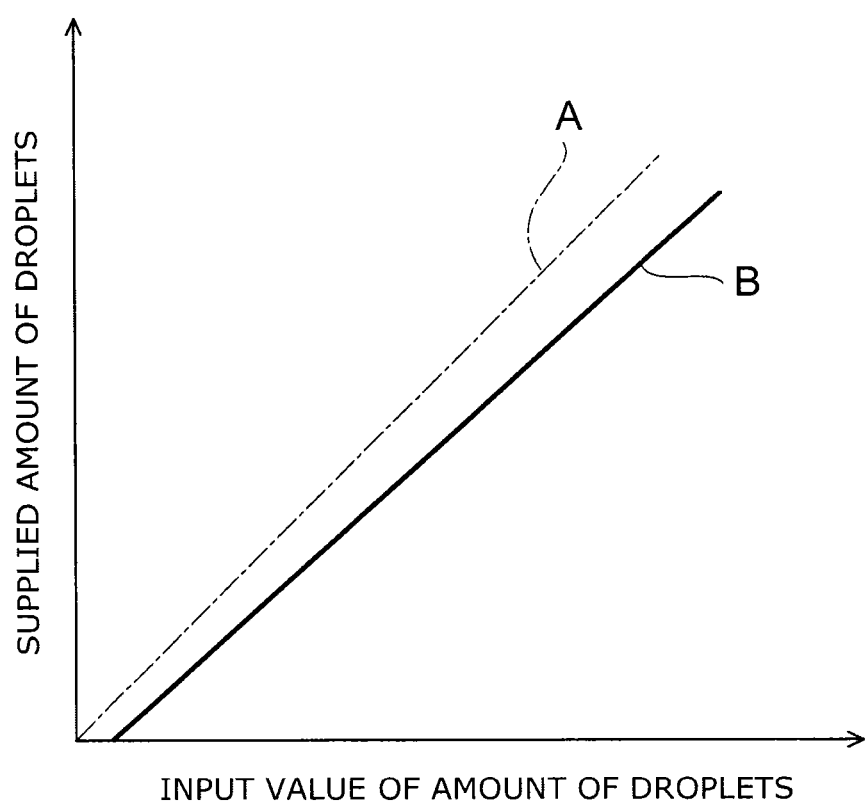
FIG. 4 is a schematic graph showing a relationship between input values of the amount of the droplet and a supplied amount of the droplet.

FIG. 4 is a schematic graph showing a relationship between input values of the amount of the droplet and a supplied amount of the droplet.

In FIG. 4, the horizontal axis represents the input value (specified value) of the amount of the droplet and the vertical axis represents the supplied amount of the droplet (the amount of the droplet actually supplied).

Also in FIG. 4, A is the case for which the input value of the amount of the droplet and the supplied amount of the droplet match each other. B is the case for which there is a discrepancy between the input value of the amount of the droplet and the supplied amount of the droplet.

In the case for which there is a discrepancy between the input value of the amount of the droplet and the supplied amount of the droplet, the difference between the input value of the amount of the droplet and the supplied amount of the droplet may be set as the fourth input data. The amount of the droplet can then be corrected using the fourth input data. For example, the amount of the droplet can be corrected by taking into account the difference between the amount of the droplet and the supplied amount of the droplet. In this case, the relationship between the input value of the amount of the droplet and the supplied amount of the droplet may, for example, be determined by performing an experiment, a simulation or the like.

As illustrated above, the density of the pattern is determined for each first region, and the amount of the droplet required for each first region is determined using the determined density of the pattern and the above-described other data. Hence, the determined amount of the droplet required for each first region takes the density of the pattern into consideration.

Consequently, the evaluation value also takes the density of the pattern into consideration.

Next, the procedure for determining an initial positioning of the droplets in the above-described Step S40 will be described in more detail.

The contact form when the template contacts the droplets disposed on the base body may include point contact, line contact and surface contact. The difference in contact form is, for example, caused by the form of the template, deformation of the template, the characteristics and individual differences in the device that presses the template onto the droplets, and the like. Note that deformation of the template includes a case in which the template is deformed and a case in which template is deformed intentionally.

Here, based on the findings obtained by the inventors, if the template contact form differs, the direction in which the droplet flows when the template is pressed onto the droplets will differ.

Hence, when determining the initial positioning of the droplet, the template contact form (point contact, line contact and surface contact) is taken into consideration.

First, the initial positioning when the template contact form is point contact will be described.

Figure 5:
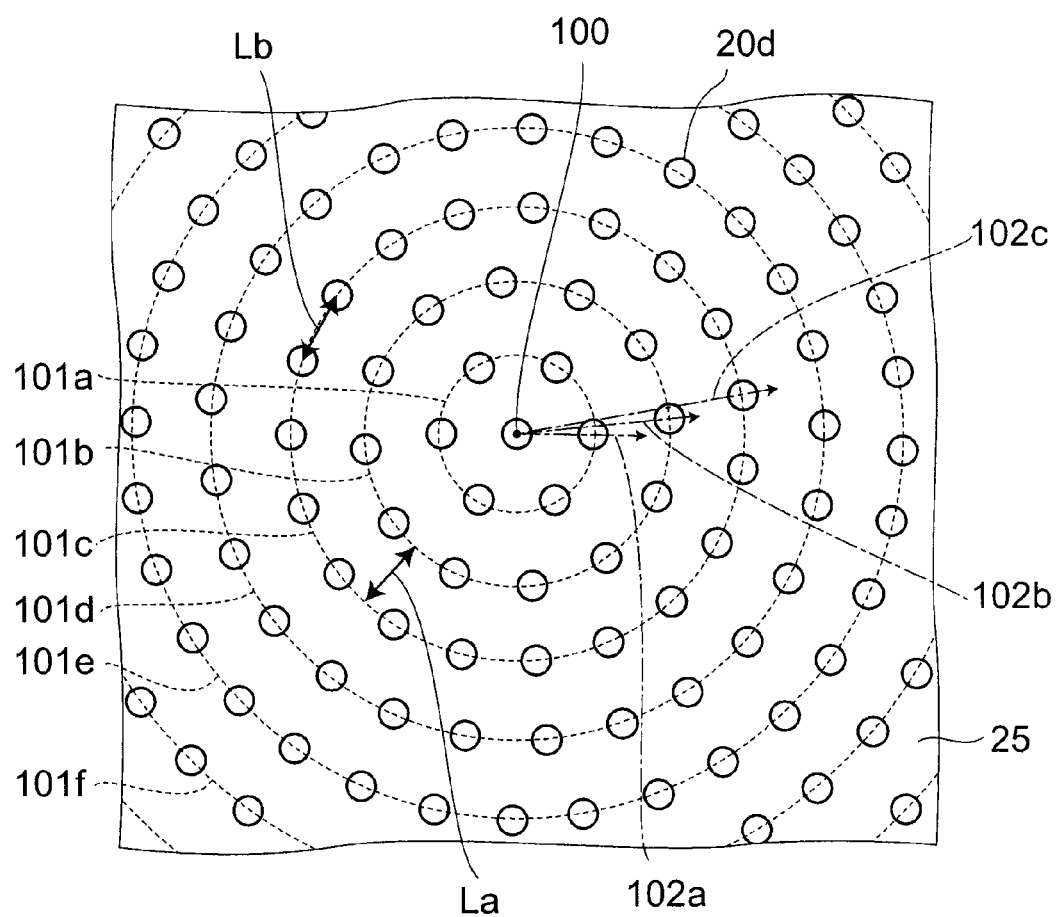
FIG. 5 is a schematic view illustrating an initial positioning when the template contact form is point contact.

FIG. 5 is a schematic view illustrating an initial positioning when the template contact form is point contact.

When the template contact form is point contact, the droplets 20d are disposed on concentric circular layers 101a to 101f, centered on a contact point 100.

A distance La between each of the layers 101a to 101f is set to be same, and a center-to-center distance Lb between adjacent droplets 20d in each of the layers 101a to 101f is set to be the same. Further, the distance La and the center-to-center distance Lb are set to be the same.

In the case that the template contact form is point contact, when the template is pressed onto the droplets 20d, the droplets 20d flow in a radiation direction centered on the contact point 100. In other words, as the contact surface area between the template and the droplets 20d is increased from the contact point 100 toward the outside of the template, the droplets 20d flow toward the outside of the template, that is, in directions that connect the contact point 100 and the centers of the droplets 20d.

Hence, the center lines of flow of the droplets 20d provided in the layers 101a to 101f (such as those indicated by arrows 102a to 102c in FIG. 5) do not overlap.

Here, when the template is pressed onto the droplets 20d, the pressing force causes the droplets 20d to flow toward the outside of the template. With this configuration, air is also discharged toward the outside of the template. Hence, when the template is pressed onto the droplets 20d, pocketing of the air of the droplets 20d is suppressed and the pattern of the template is filled with the droplets 20d.

Thus, when the template contact form is point contact, the droplets 20d are disposed at equal intervals on the plurality of concentric circular layers 101a to 101f provided at equal intervals centered on the contact point 100. Also, the center-to-center distance Lb between adjacent droplets 20d and gap (distance La) between the concentric circular layers 101a to 101f are set to be the same. The arrangement is such that lines from the contact point 100 extending through the centers of the droplets 20d toward the outside of the face 25 for forming the base body pattern do not overlap.

Note that the total number of droplets 20d disposed on the face 25 for forming the pattern is the number determined in Step S30. The distance La and the center-to-center distance Lb may be determined from the total number of droplets 20d, the dimensions and area of the face 25 for forming the pattern, and the like.

FIGS. 6A to 6E are schematic views illustrating initial positioning of droplets when the template contact form is point contact.

Note that the droplets 20d are omitted from the drawings and only the concentric circular layer 101 where the droplets 20d are provided is illustrated.

Figure 6A:
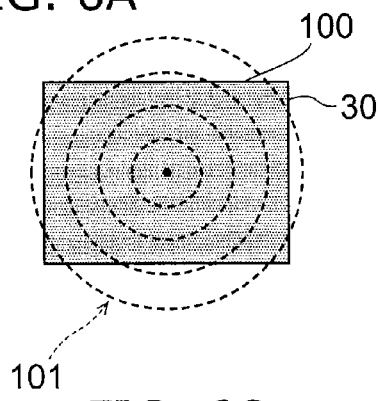
FIGS. 6A to 6E are schematic views illustrating initial positioning of droplets when the template contact form is point contact.
Figure 6B:
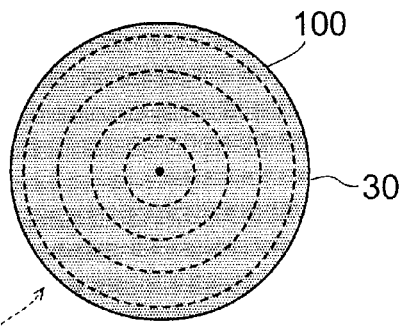
Figure 6C:
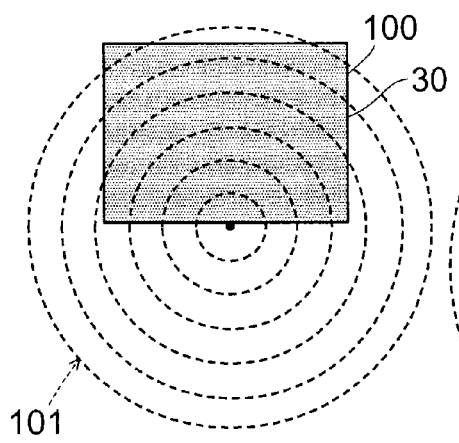
Figure 6D:
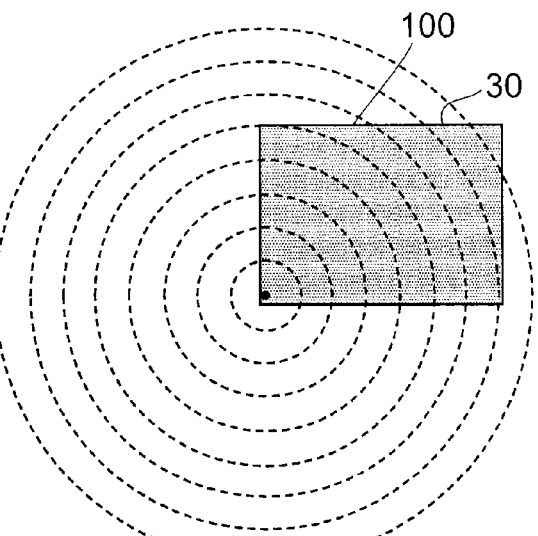
Figure 6E:
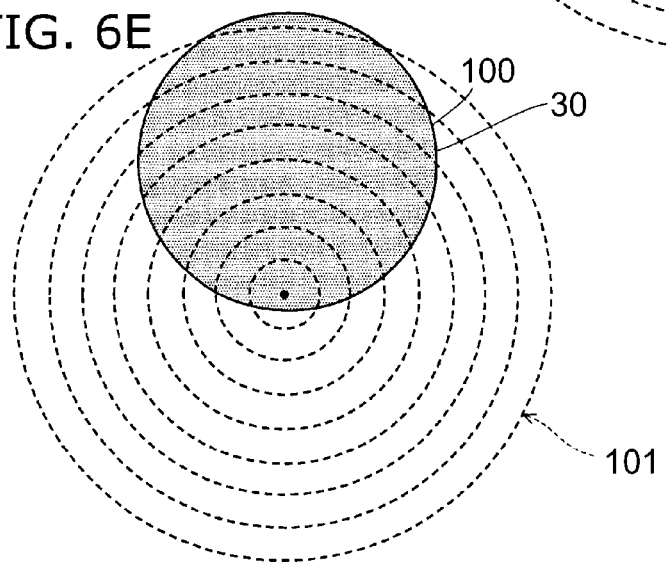

FIG. 6A illustrates a case in which the contact point 100 is at the center of a rectangular template 30; FIG. 6B illustrates a case in which the contact point 100 is at the center of a circular template 30; FIG. 6C illustrates a case in which the contact point 100 is at a peripheral edge of the rectangular template 30; FIG. 6D illustrates a case in which the contact point 100 at a region near a corner portion of the rectangular template 30; and FIG. 6E illustrates a case in which the contact point 100 is at a region near a peripheral edge of the circular template 30.

Note that this embodiment can be implemented even when the base body is a storage medium such as a magnetic storage hard disk or the like. For example, the embodiment may be used when forming a pattern on a storage face of a storage medium such as a hard disk. When hard disks are circular, the points described in the above embodiments may be applied to obtain similar effects for the positioning of droplets such as a resist material or the like.

Next, the initial positioning when the template contact form is line contact will be described.

Figure 7:
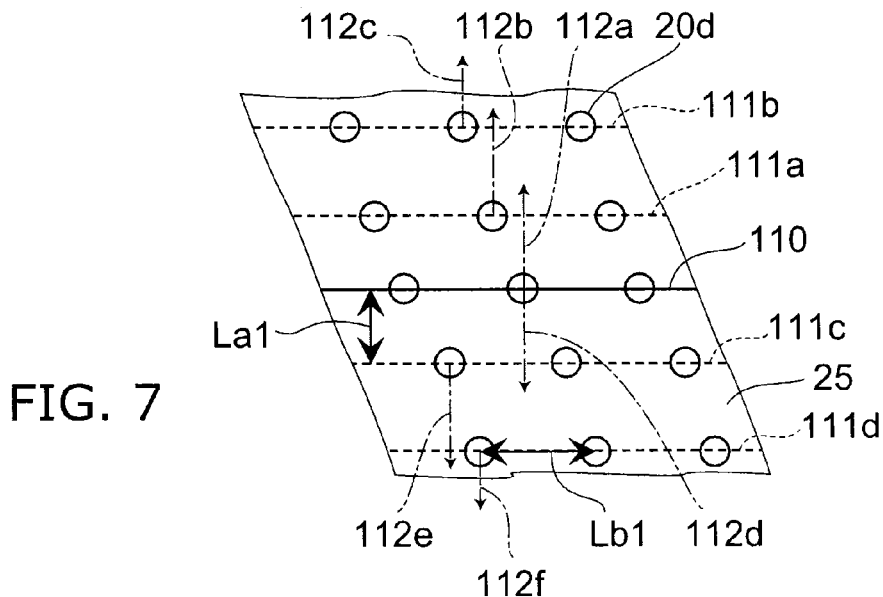
FIG. 7 is a schematic view illustrating an initial positioning when the template contact form is line contact.

FIG. 7 is a schematic view illustrating an initial positioning when the template contact form is line contact.

When the template contact form is line contact, the droplets 20d are disposed on layers 111a to 111d parallel to a contact line 110.

A distance La1 between the layers 111a to 111d is set to be the same, and a center-to-center distance Lb1 between adjacent droplets 20d in each of the layers 111a to 111d is set to be the same. Further, the distance La1 and the center-to-center distance Lb1 are set to be the same.

In the case that the template contact form is line contact, when the template is pressed onto the droplets 20d, the droplets 20d flow toward the outside of the template, that is, in a direction perpendicular to the contact line 110.

In other words, as the contact surface area between the template and the droplets 20d is increased from the contact line 110 toward the outside of the template, that is, in a direction perpendicular to the contact line 110, the droplets 20d flow toward the outside of the template, that is, in a direction perpendicular to the contact line 110.

Hence, the center lines of flow of the droplets 20d provided in the layers 111a to 111d (such as those indicated by arrows 112a to 112e in FIG. 7) do not overlap.

Here, when the template is pressed onto the droplets 20d, the pressing force causes the droplets 20d to flow toward the outside of the template. With this arrangement, air is also discharged toward the outside of the template. Hence, when the template is pressed onto the droplets 20d, pocketing of the air of the droplets 20d is suppressed and the pattern of the template is filled with the droplets 20d.

Thus, when the template contact form is line contact, the droplets 20d are disposed at equal intervals on the plurality of linear layers 111a to 111d provided at equal intervals in parallel to the contact line 110 centered on the contact line 110. Also, the center-to-center distance Lb1 between adjacent droplets 20d and gap (distance La1) between the linear layers 111a to 111d are set to be equal. The arrangement is such that lines extending perpendicular to the linear layers 111a to 111d, from centers of the droplets 20d toward the outside of the face 25 for forming the base body pattern do not overlap.

Note that the total number of droplets 20d disposed on the face 25 for forming the pattern is the number determined in Step S30. The distance La and the center-to-center distance Lb may be determined from the total number of droplets 20d, the dimensions and area of the face 25 for forming the pattern, and the like.

FIGS. 8A to 8D are schematic views illustrating initial positioning of droplets when the template contact form is line contact.

Note that the droplets 20d are omitted from the drawings and only the parallel line-shaped layer 111 where the droplets 20d are provided is illustrated.

Figure 8A:
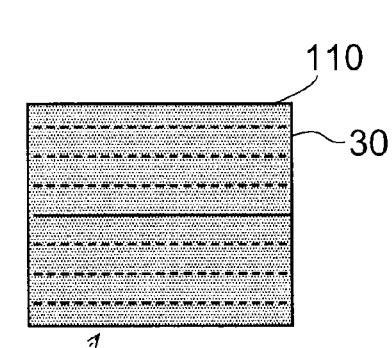
FIGS. 8A to 8D are schematic views illustrating initial positioning of droplets when the template contact form is line contact.
Figure 8B:
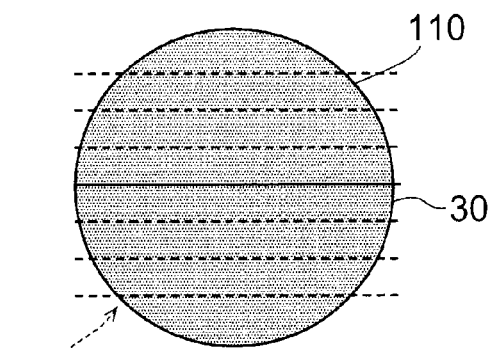
Figure 8C:
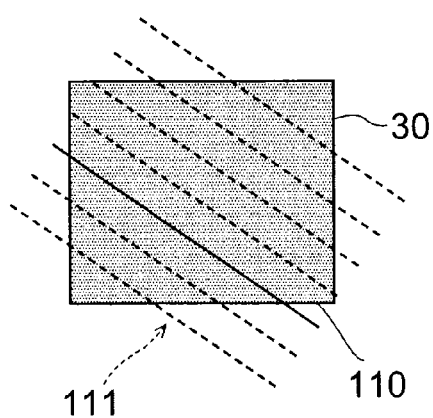
Figure 8D:
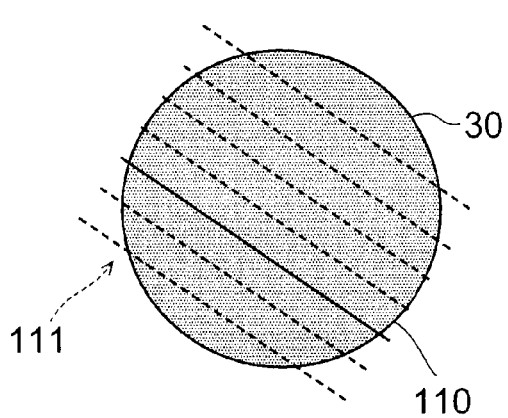

FIG. 8A illustrates a case in which a center line of a rectangular template 30 is the contact line 110; FIG. 8B illustrates a case in which the center line of a circular template 30 is the contact line 110; FIG. 8C illustrates a case in which an off-center line of the rectangular template 30 is the contact line 110; and FIG. 8D illustrates a case in which the off-center line of the circular template 30 is the contact line 110.

Thus, when the template contact form is line contact, a rectangular or a circular template may be used. When the rectangular template is used, the template may be pressed in such a way that the contact surface area between the template and the disposed droplets 20d is increased from a first external edge toward a second external edge that opposes the first external edge, causing the droplets 20d to flow in the same direction. When the rectangular template is used, the template may be pressed in such a way that the contact surface area between the template and the disposed droplets 20d is increased from a portion located at a first corner toward a second corner that opposes the first corner, causing the droplets 20d to flow in the same direction. In addition, when the circular template is used, the template may be pressed in such a way that the contact surface area between the template and the disposed droplets 20d is increased from a first portion on the circumference toward a second portion on the circumference that opposes the first portion on the circumference, causing the droplets 20d to flow in the same direction.

For both rectangular and circular templates, when the template contact form is line contact, the template may be pressed so that the template is bent so as to be folded, a line contact is made from the folded edge portion and the contact surface area between the template and the disposed droplets 20d is increased outward on both sides, causing the droplets 20d to flow in the same direction.

Next, the initial positioning when the template contact form is surface contact will be described.

Figure 9:
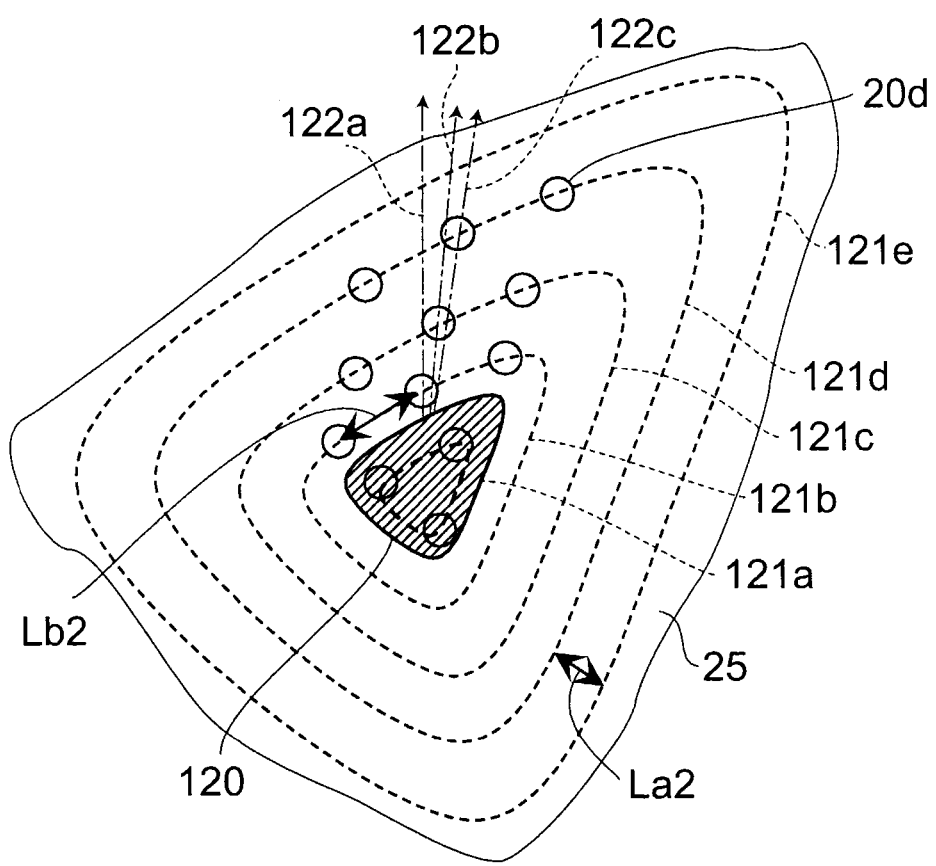
FIG. 9 is a schematic view illustrating an initial positioning when the template contact form is surface contact.

FIG. 9 is a schematic view illustrating an initial positioning when the template contact form is surface contact.

When the template contact form is surface contact, the droplets 20d are disposed on layers 121a to 121e which have similar outlines to a contact surface 120.

A distance La2 between the layers 121a to 121e is set to be the same, and a center-to-center distance Lb2 between adjacent droplets 20d in each of the layers 121a to 121e is set to be the same. Further, the distance La2 and the center-to-center distance Lb2 are set to be the same.

In the case that the template contact form is surface contact, when the template is pressed onto the droplets 20d, the droplets 20d flow toward the outside of the template, that is, in directions that connect a centroid of the contact surface 120 (center of the drawing) to the centers of the droplets 20d.

In other words, as the contact surface area between the template and the droplets 20d is increased from the contact surface 120 toward the outside of the template, the droplets 20d flow toward the outside of the template, that is, in directions that connect the contact surface 120 and the centers of the droplets 20d.

Hence, the center lines of flow of the droplets 20d provided in the layers 121a to 121e (such as those indicated by arrows 122a to 122c in FIG. 9) do not overlap.

Here, when the template is pressed onto the droplets 20d, the pressing force causes the droplets 20d to flow toward the outside of the template. With this configuration, air is also discharged toward the outside of the template. Hence, when the template is pressed onto the droplets 20d, pocketing of the air of the droplets 20d is suppressed and the pattern of the template is filled with the droplets 20d.

Specifically, when the template contact form is surface contact, the droplets 20d are disposed at equal intervals on the plurality of layers 121a to 121e with similar outlines to the contact surface 120 provided at equal intervals centered on the contact surface 120. Also, the center-to-center distance Lb2 between adjacent droplets 20d and gap (distance La2) between the layers 121a to 121e with similar outlines to the contact surface 120 are set to be equal. The arrangement is such that lines from the centroid of the contact surface 120 extending through the centers of the droplets 20d toward the outside of the face 25 for forming the base body pattern do not overlap.

Note that the total number of droplets 20d disposed on the face 25 for forming the pattern is the number determined in Step S30. The distance La2 and the center-to-center distance Lb2 may be determined from the total number of droplets 20d, the dimensions and area of the face 25 for forming the pattern, and the like.

Figure 10A:
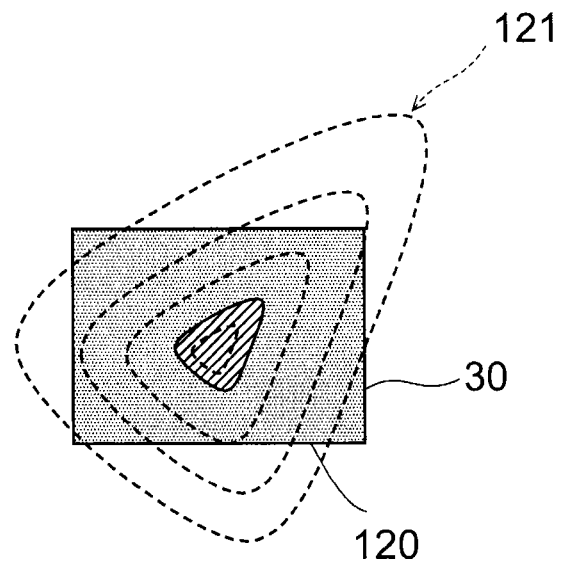
FIGS. 10A and 10B are schematic views illustrating initial positioning of droplets when the template contact form is surface contact.
Figure 10B:
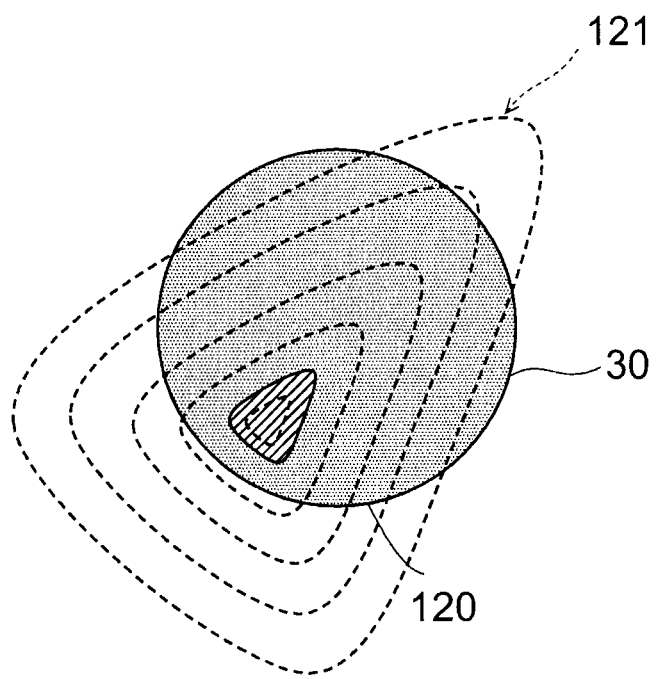

FIGS. 10A and 10B are schematic views illustrating initial positioning of droplets when the template contact form is surface contact.

Note that the droplets 20d are omitted from the drawings and only the layer 121 with similar outlines to the contact surface 120 where the droplets 20d are provided is illustrated.

FIG. 10A illustrates a case in which the contact surface 120 is at a center region of a rectangular template 30, and FIG. 10B illustrates a case in which the contact surface 120 is at a circumferential edge region of a circular template 30.

Next, the procedure for dividing the face 25 for forming the pattern using second regions in the above-described Step S50 is described in more detail.

Figure 11:
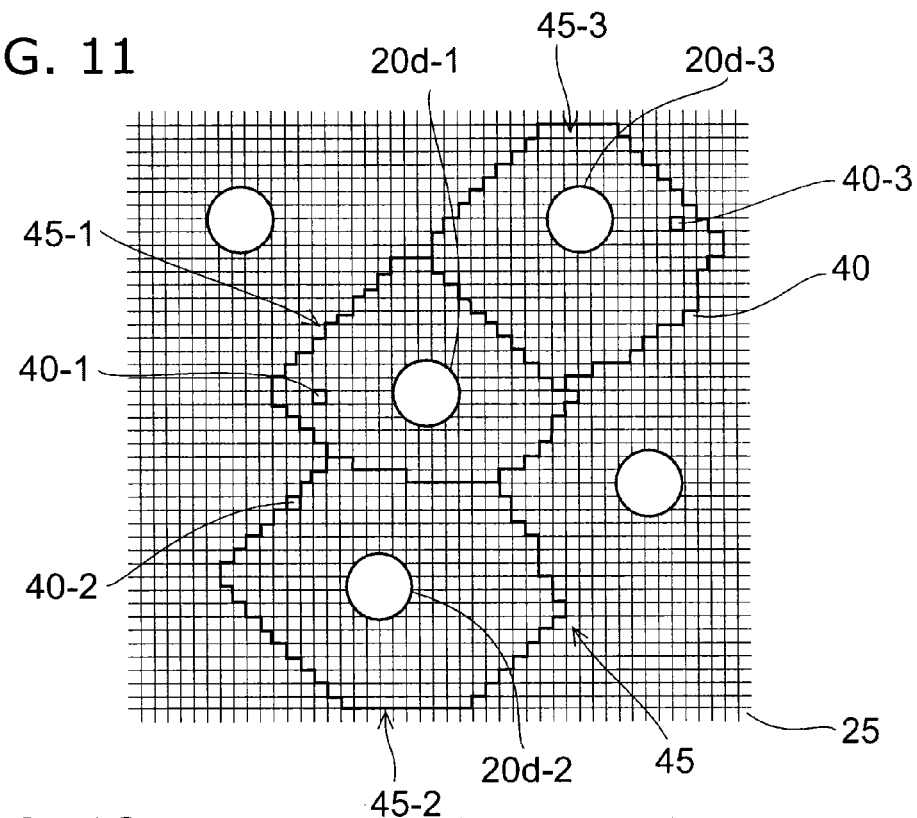
FIG. 11 is a schematic view illustrating the procedure for dividing the face for forming the pattern using second regions.

FIG. 11 is a schematic view illustrating the procedure for dividing the face for forming the pattern using second regions.

FIG. 11 illustrates a state in which the face 25 for forming the pattern has been divided into a plurality of first regions 40 in the above-described Step S10 and the droplets 20d have been disposed in the initial positioning on the face 25 for forming the pattern in Step S40.

The first regions 40 are each assigned to most proximate droplet 20d, and the first regions 40 assigned to the most proximate droplets 20d are grouped as the second regions 45.

In other words, in Step S50, the face 25 for forming the pattern is redivided using the second regions 45.

For example, the first region 40-1 is most proximate to the droplet 20d-1. Hence, the first region 40-1 belongs to the second region 45-1 assigned to the droplet 20d-1.

On the other hand, the first region 40-2 is most proximate to the droplet 20d-2, not the droplet 20d-1. Hence, the first region 40-2 belongs to the second region 45-2 assigned to the droplet 20d-2.

Further, the first region 40-3 is most proximate to the droplet 20d-3. Hence, the first region 40-3 belongs to the second region 45-3 assigned to the droplet 20d-3.

Thus, the first regions 40 are each assigned to the most proximate droplet 20d, and the first regions 40 assigned to the most proximate droplets 20d are grouped as the second regions 45. This assignment process is performed for all of the first regions 40 on the face 25 for forming the pattern.

Next, the procedure for determining an evaluation value in the above-described Step S60 will be described in more detail.

The evaluation value may be determined using formula (1) below.

$$\text{Evaluation value} = (\text{amount of a single droplet})/(\text{total amount of determined droplet required for each first region 40 belonging to second region 45}) \quad (1)$$

Here "amount of a single droplet" corresponds to a volume of droplet 20d existing in each second region 45. In other words, the amount of a single droplet is the supplied amount of droplet 20d for each of the second regions 45.

Further, "total amount of determined droplet required for each first region 40 belonging to second region 45" is a sum of the amounts of the droplet required for each first region belonging to a given second region 45. In other words, "total amount of determined droplet required for each first region 40 belonging to second region 45" is the amount of the droplet 20d required in each second region 45.

The evaluation value for each second region 45 is therefore more preferable as the value approaches "1".

If the evaluation value exceeds "1", in the second region 45 to be evaluated, the supplied amount of the droplet 20d will be greater than the required amount. There is therefore a risk that a thickness measurement of the later-described residual film will be too thick.

Conversely, if the evaluation value is less than "1", in the second region 45 to be evaluated, the supplied amount of the droplet 20d will be less than the required amount. There is therefore a risk that portions in the recesses of the pattern of the template will not be filled and that the thickness measurement of the later-described residual film will be too thin.

Thus, in the above-described Step S70, whether or not a distribution of the evaluation values on the face 25 for forming the pattern is in a target range is determined.

Here, for example, a difference between the maximum and minimum evaluation values, a maximum value of the absolute value of the difference between the evaluation value and "1", a standard deviation or the like may be used as an indicator of whether or not the distribution of evaluation values is in the target range.

Next, the procedure for performing positioning update for the droplets in the above-described Step S90 will be described in more detail.

There is no guarantee that simply determining the initial positioning of the droplets 20d will provide a distribution of the evaluation values that is in the target range on the face 25 for forming the pattern. Thus, by performing positioning update for the droplets 20d, the evaluation value for each second region 45 is brought closer to "1".

Figure 12:
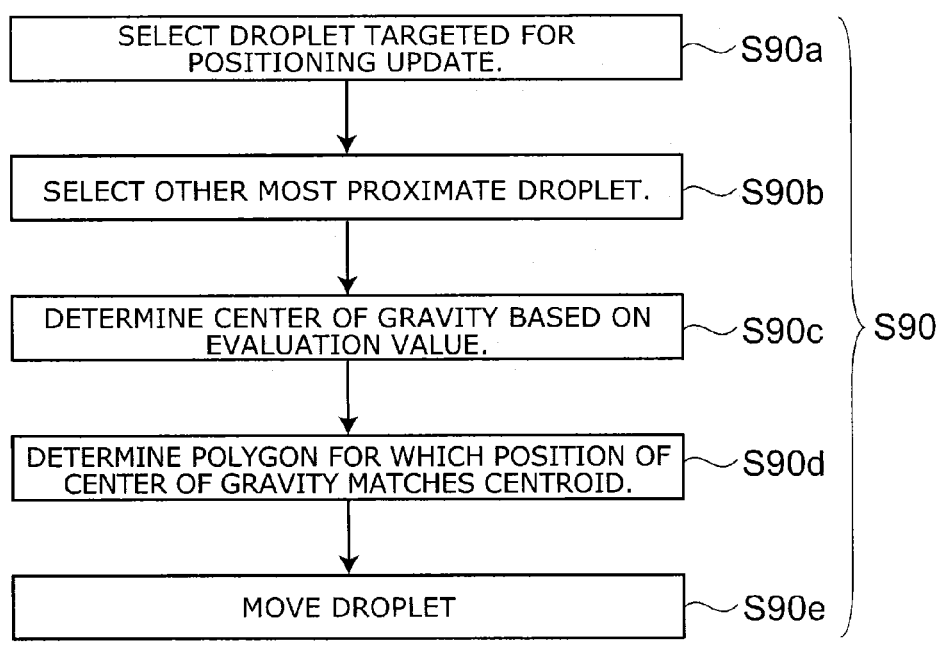
FIG. 12 is a flowchart illustrating the procedure for performing positioning update for the droplets.

FIG. 12 is a flowchart illustrating the procedure for performing positioning update for the droplets.

Figure 13:
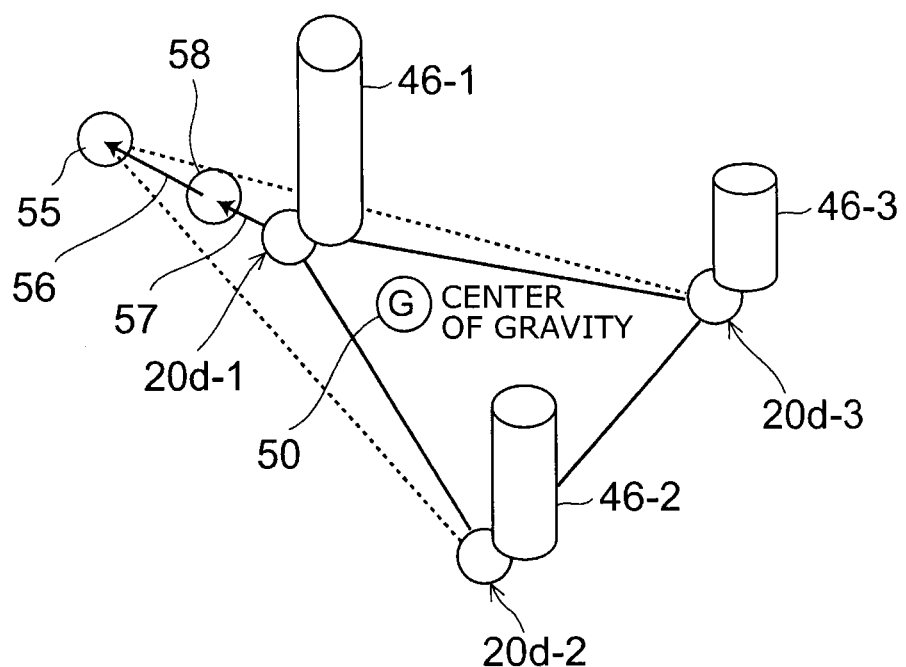
FIG. 13 is a conceptual view illustrating the procedure for performing positioning update for the droplets.

FIG. 13 is a conceptual view illustrating the procedure for performing positioning update for the droplets.

In FIG. 13, an evaluation value for the second region 45-1 is an evaluation value 46-1, an evaluation value for the second region 45-2 is an evaluation value 46-2, and an evaluation value for the second region 45-3 is an evaluation value 46-3. Further, the evaluation values 46-1 to 46-3 are represented by the height of columns, with a higher column representing a greater evaluation value.

Further, as illustrated in FIG. 12 and FIG. 13, droplets to be targeted for positioning update are first selected from among the plurality of droplets 20d (Step S90a).

For example, the droplet 20d-1 having the greatest evaluation value 46-1 is selected.

Next, at least one another droplet most proximate to the droplet 20d-1 is selected (Step S90b).

Note that in the following, a case in which the two droplets most proximate to the droplet 20d-1 are selected is illustrated.

In this case, as illustrated in FIG. 13, the droplet 20d-2 and the droplet 20d-3 most proximate to the droplet 20d-1 are selected.

Next, the evaluation values for each of the second region 45-1, the second region 45-2 and the second region 45-3 are, for example, converted to weights, and a center of gravity 50 is determined based on the weights resulting from the conversion (Step S90c).

The center of gravity 50 is a point where the weights resulting from the conversion of the evaluation values can be balanced.

In the case illustrated in FIG. 13, the value of the evaluation values becomes greater as the height of the column increases, and so the weight also increases as the height of the column increases.

In such cases, the center of gravity 50 based on the evaluation values 46-1 to 46-3 will differ from the centroid of the triangle formed with vertices at the center points of the droplets 20d-1 to 20d-3. For example, the center of gravity 50 will tend towards the heaviest evaluation value 46-1 side.

Next, a polygon is formed with the center of gravity 50 as the centroid. For example, when the droplet 20d-1 having the greatest evaluation value is the target for the positioning update, the position of the droplet 20d-1 is changed to obtain a polygon with the center of gravity 50 to be the centroid (Step S90d).

In FIG. 13, a triangle is illustrated as a polygon. In the triangle, the center points of the droplets 20d-2 and 20d-3 form two of the vertices. Then, when the position of the droplet 20d-1 is located at the position of a vertex 55, the center of gravity 50 is located so as to be the centroid.

Next, a vector 56 pointing from the center point of the droplet 20d-1 toward the vertex 55 is drawn.

Next, a movement vector 57 which is r (r<1) times as the vector 56 is determined. Then, the droplet 20d-1 is moved toward the polygon vertex 55. For example, the droplet 20d-1 is moved along the movement vector 57 to the position of a vertex 58 (Step S90e).

When the polygon is a triangle, "r" may be not less than $\frac{1}{10}$ and not more than $\frac{1}{2}$.

The positioning update is implemented for at least one of all the droplets 20d.

Thereafter, after returning to the above-described Step S50 and proceeding to Step S60, whether or not the distribution of the evaluation values on the face 25 for forming the pattern is in the target range is determined again.

In the example illustrated in FIG. 13, this process is performed for the droplets 20d-1 to 20d-3, but in reality other droplets also exist. Hence, the position of the droplet 20d-1 will affect on not only the droplets 20d-2 and 20d-3, but also other droplets. In this case, when the droplet 20d-1 is moved to the vertex 55 at a time, the positional relationship with the droplets 20d-2 and 20d-3 is appropriate, but the positional relationship with the other droplets may be inappropriate. Thus, the movement amount of the droplet targeted for the positioning update is set to be r (r<1) times, taking the positional relationship with the other droplets into consideration. Specifically, by moving the droplets targeted for the positioning update little by little, not only the positional relationship of all of the droplets, but also the distribution of the evaluation values on the face 25 for forming the pattern can be easily converged within the target range.

Note that in FIG. 13, a case in which the two droplets most proximate to the droplet 20d-1 are selected is illustrated. However, the number of the droplets to be selected most proximate to the droplet 20d-1 may be one, or may be three or greater.

Specifically, in the repositioning at least any of the droplets, the droplet may be moved by the following procedure. At least one another droplet most proximate to the droplet targeted for repositioning is selected. Next, the evaluation value of the droplet targeted for repositioning and the evaluation value of the selected at least one another droplet are converted to weights, and a center of gravity is determined based on the weights resulting from the conversion. Next, the position of the selected at least one another droplet is fixed, and a position of the droplet targeted for repositioning is determined such that the center of gravity of the weights is to be the centroid. Next, the droplet targeted for repositioning is moved toward the position determined for the droplet targeted for repositioning.

As described above, with the droplet positioning method according to this embodiment, the droplets 20d can be disposed at appropriate positions on the face 25 for forming the pattern. Hence, when forming a pattern using imprint methods, generation of unfilled portions of recesses of the pattern of the template and the occurrence of inappropriate thickness measurements in a later-described residual film can be suppressed. Consequently, transcription can be improved.

Next, an example is described in which the plurality of droplets 20d is disposed on a face 10a for forming a base body 10 pattern using the droplet positioning method according to this embodiment to form the pattern using an imprint method.

FIGS. 14A to 14C and FIGS. 15A to 15C are schematic process cross-sectional views illustrating formation of the pattern.

Note that in FIGS. 14A to 14C and FIGS. 15A to 15C, an example of forming a resist mask used in the manufacture of electronic devices such as semiconductor devices is illustrated.

Figure 14A:
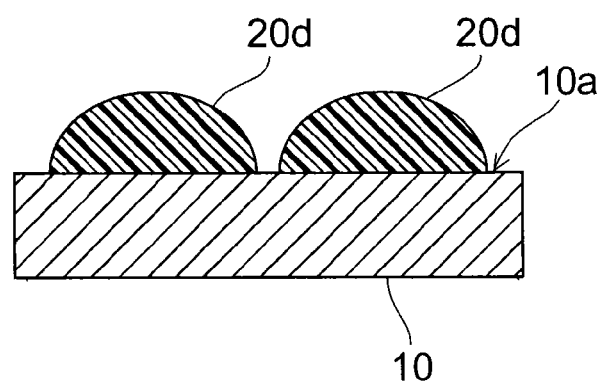
FIGS. 14A to 14C and FIGS. 15A to 15C are schematic process cross-sectional views illustrating formation of the pattern.

First, as illustrated in FIG. 14A, the plurality of droplets 20d is disposed on the face 10a for forming the base body 10 pattern such as a semiconductor wafer, a glass substrate or the like. The positioning of the droplets 20d can be determined using the droplet positioning method according to this embodiment. Then, the droplets 20d can be provided at the predetermined positions on the face 10a for forming the base body 10 pattern using, for example, an inkjet method or the like. For example, the droplets 20d can be provided at the predetermined positions on the face 10a for forming the base body 10 pattern by controlling piezoelectric devices provided for each nozzle of a dispensing device such as an inkjet device or the like.

The droplets 20d may be provided on the face 10a for forming the base body 10 pattern in a single shot or in one or more shots.

The droplets 20d may be formed from a material including, for example, an acrylic light curing resin, a solvent and the like.

An amount of a single droplet 20d may, for example, be approximately from 1 pl (picoliter) to 6 pl (picoliters).

Figure 14B:
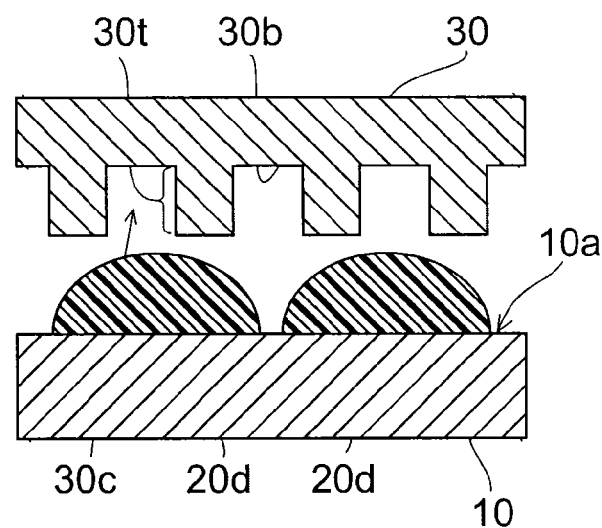

Next, as illustrated in FIG. 14B, the template 30 is set so as to oppose the face 10a for forming the base body 10 pattern. On the side of the template 30 opposing the base body 10 is formed a pattern including protrusions 30t and recesses 30c. A height from a bottom face 30b of the recesses 30c to a top of the protrusions 30t will be referred to as a "pattern height". The pattern height is, for example, 60 nm. A material of the template 30 is, for example, quartz ($SiO_2$).

Figure 14C:
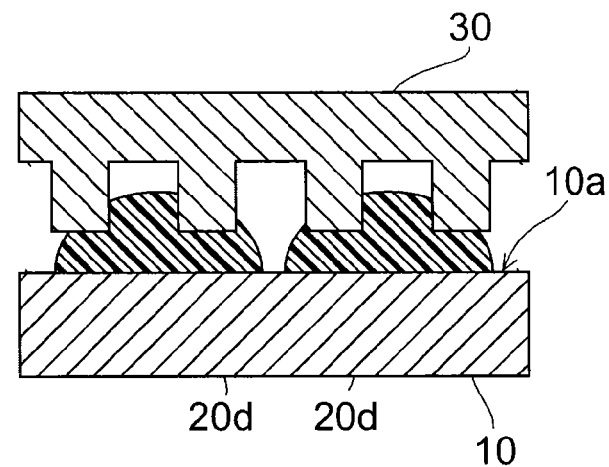

Next, as illustrated in FIG. 14C, the template 30 is lowered toward the base body 10 and then pressed onto the droplets 20d.

Figure 15A:
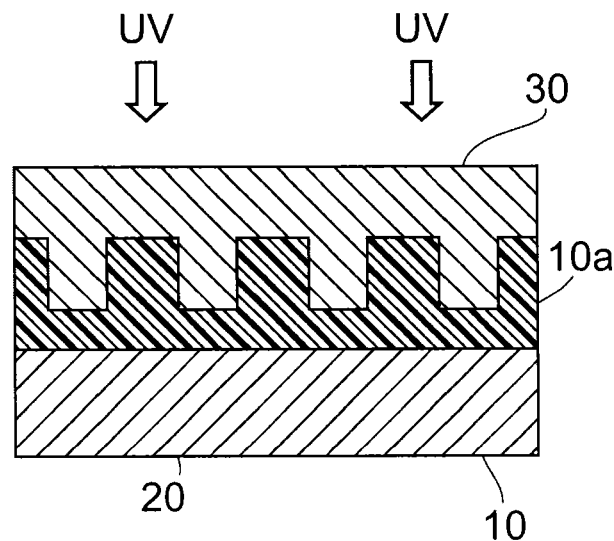

As illustrated in FIG. 15A, the droplets 20d pressed by the template 30 deform three dimensionally on the base body 10, thereby forming on the base body 10 a transfer subject body 20 to which the pattern of the template 30 is transferred.

In other words, the transfer subject body 20 with a surface processed to include recesses and protrusions is formed between the template 30 and the base body 10.

Next, the transfer subject body 20 is irradiated with ultraviolet (UV) light via the template 30 to cure the transfer subject body 20.

Figure 15B:
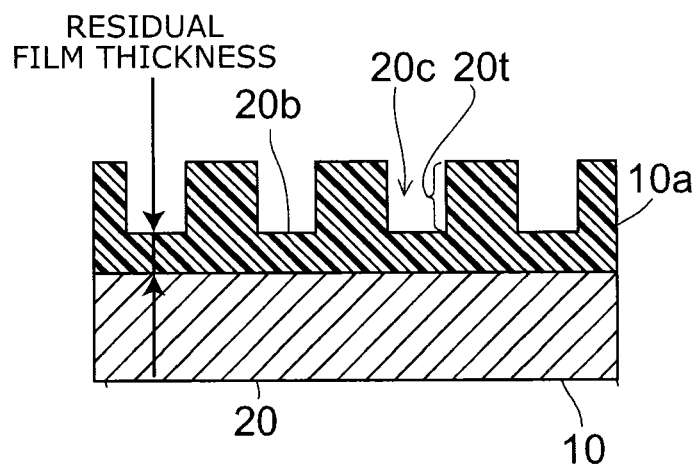

Next, as illustrated in FIG. 15B, the template 30 is separated from the transfer subject body 20. As a result, the surface of the transfer subject body 20 is exposed. The transfer subject body 20 has formed therein protrusions 20t and recesses 20c.

A height from a bottom face 20b of the recesses 20c to a top of the protrusions 20t of the transfer subject body 20 corresponds to the "pattern height". In this case, a thickness of the transfer subject body 20 between the bottom face 20b of the transfer subject body 20 and the face 10a for forming the base body 10 pattern will be referred to as a "residual film thickness". The residual film thickness is, for example, 15 nm.

Figure 15C:
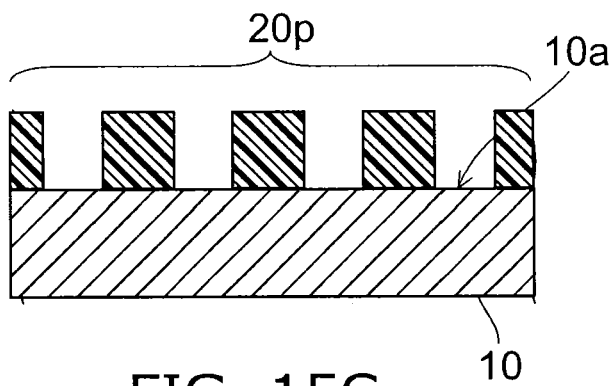

Next, as illustrated in FIG. 15C, the residual film is removed by implementing dry etching on the transfer subject body 20 to form a resist mask 20p.

For the dry etching, reactive ion etching (RIE) may be used.

When the dry etching is performed on the transfer subject body 20, the protrusions 20t on the transfer subject body 20 are reduced in thickness. On the other hand, in the recesses 20c, the bottom face 20b is etched and the residual film is thereby removed. As a result, a resist mask 20p having a line-and-space form is formed on the face 10a for forming the base body 10 pattern.

Here, the plurality of droplets 20d is disposed on the face 10a for forming the base body 10 pattern using the droplet positioning method according to this embodiment. Hence, when forming a pattern using imprint methods, the generation of unfilled portions of recesses 30c of the pattern of the template 30 and the occurrence of inappropriate thickness measurements in the residual film can be suppressed. As a result, the resist mask 20p can be formed with high level of transfer accuracy.

The resist mask 20p formed in the manner described above may be used in the manufacture of electronic devices such as semiconductor devices. For example, the resist mask 20p can be used to implement dry etching on a process film positioned under the resist mask 20p.

Note that while an example has been described in which the resist mask 20p was formed, the method is not limited to the formation of resist masks.

For example, the method can be widely applied for forming patterns in fields such as optical devices, recording media, chemical/bio devices and micro electro mechanical systems (MEMS).

Second Embodiment

Next, a droplet positioning device according to a second embodiment will be described.

In this embodiment, a wafer for a semiconductor, a glass substrate, or the like is, for example, used as the base body. For the plurality of droplets to be disposed on the face for forming the pattern, so-called resist drop bodies are, for example, used. As a material for the resist drop bodies, a light (UV light or the like) curing resin may be used.

Figure 16:
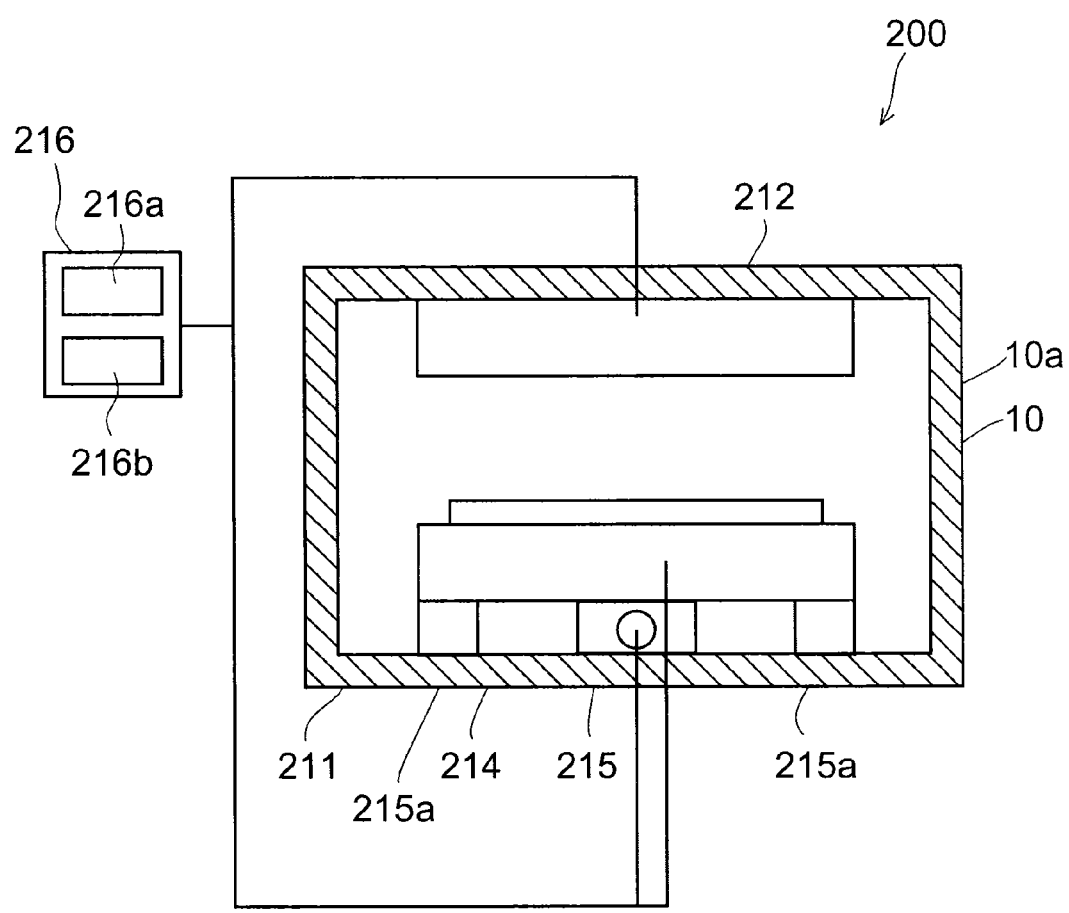
FIG. 16 is schematic view illustrating the droplet positioning device according to the second embodiment.

FIG. 16 is schematic view illustrating the droplet positioning device according to the second embodiment. As illustrated in FIG. 16, a droplet positioning device 200 is provided with a processing container 211, a dispensing unit 212, a mounting unit 214, a moving unit 215 and a control unit 216.

Inside the processing container 211, the dispensing unit 212 and the mounting unit 214 are provided so as to oppose each other. Hence, when the base body 10 is held on a mounting face of the mounting unit 214, the dispensing unit 212 and the face 10a for forming the base body 10 pattern are arranged to be opposite each other.

The dispensing unit 212 dispenses a material of the droplet 20d supplied from a supply unit not illustrated in the drawings toward the face 10a for forming the base body 10 pattern mounted on the mounting unit 214. For the dispensing unit 212, a dispensing device such as an inkjet device may, for example, be used.

The mounting unit 214 includes a holding unit such as an electrostatic chuck, not illustrated in the drawings, and holds the base body 10 mounted on the mounting face. Note that the holding unit is not limited to the examples described above, but can be varied as appropriate. For example, a mechanical chuck, a vacuum chuck or the like may be used.

The moving unit 215 changes a position of the mounting unit 214 in a direction parallel to the face 10a for forming the base body 10 pattern.

In the following, an example is described in which the moving unit 215 changes a position of the mounting unit 214 in a horizontal plane.

In this case, the mounting unit 214 is movably provided on a guiding part 215a, and the moving unit 215 can change a position of the mounting unit 214 along the guiding part 215a. In the arrangement illustrated in FIG. 16, the moving unit 215 changes a position of the mounting unit 214, but the moving unit 215 may instead change a position of the dispensing unit 212. In other words, it is sufficient that the moving unit 215 changes a relative position of the dispensing unit 212 and the mounting unit 214. The movement method is not limited to the examples described above, but can be varied as appropriate.

The control unit 216 is provided with a calculating unit 216a and an element controlling unit 216b.

The calculating unit 216a determines the positions of the plurality of droplets 20d on the face 10a for forming the base body 10 pattern by using the above-described droplet positioning method. Here, the positions of the plurality of droplets 20*d* may be determined by loading a later-described droplet positioning program into the calculating unit 216*a* and executing the droplet positioning program in the calculating unit 216*a*.

Since the procedure for determining the positions of the droplets 20*d* is the same as that described above, no detailed description is given here.

The element controlling unit 216*b* controls operation of elements provided in the droplet positioning device 200. For example, the element controlling unit 216*b* controls the dispensing unit 212 to dispense the material of the droplet 20*d* toward the face 10*a* for forming the base body 10 pattern mounted on the mounting unit 214. For example, when the dispensing unit 212 is an inkjet device, the element controlling unit 216*b* controls the dispensing operations of a plurality of nozzles provided in the inkjet device. The element controlling unit 216*b* controls the mounting unit 214 to attach and release the base body 10. Also, the element controlling unit 216*b* controls the moving unit 215 to change the position of the mounting unit 214 holding the base body 10 in the horizontal plane.

The element controlling unit 216*b* also controls the dispensing unit 212 and the moving unit 215 based on the positions of the plurality of droplet 20*d* determined by the calculating unit 216*a*. In other words, the element controlling unit 216*b* controls the dispensing unit 212 and the moving unit 215 to dispense the material of the droplet 20*d* at the positions of the plurality of droplet 20*d* determined by the calculating unit 216*a*.

Next, the operations of the droplet positioning device 200 will be described.

First, the positions of the plurality of droplet 20*d* are determined by the calculating unit 216*a* of the control unit 216.

Next, the base body 10 is loaded into the processing container 211 via a loading and unloading window provided in the processing container 211 but not illustrated in the drawings by a conveyor device not illustrated in the drawings, and mounted on the mounting face of the mounting unit 214. The mounted base body 10 is held by a holding unit provided in the mounting unit 214 but not illustrated in the drawings. The mounting unit 214 (base body 10) is then moved to a predetermined position by the moving unit 215.

Next, the loading and unloading window not illustrated in the drawings is closed, and the material of the droplet 20*d* is dispensed from the dispensing unit 212 toward the predetermined positions on the base body 10 mounted on the mounting face of the mounting unit 214. In this process, the dispensing unit 212 and the moving unit 215 are controlled so that the droplets 20*d* are formed at the positions determined by the calculating unit 216*a*.

As described above, with the droplet positioning device 200 according to this embodiment, the droplets 20*d* can be disposed at appropriate positions on the face 10*a* for forming the base body 10 pattern. Hence, when forming a pattern using imprint methods, the generation of unfilled portions of recesses of the pattern of the template and the occurrence of inappropriate thickness measurements in a later-described residual film can be suppressed. Consequently, transcription can be improved.

The droplet positioning device 200 may further include a pattern forming unit 300 that forms a pattern using an imprint method.

Figure 17:
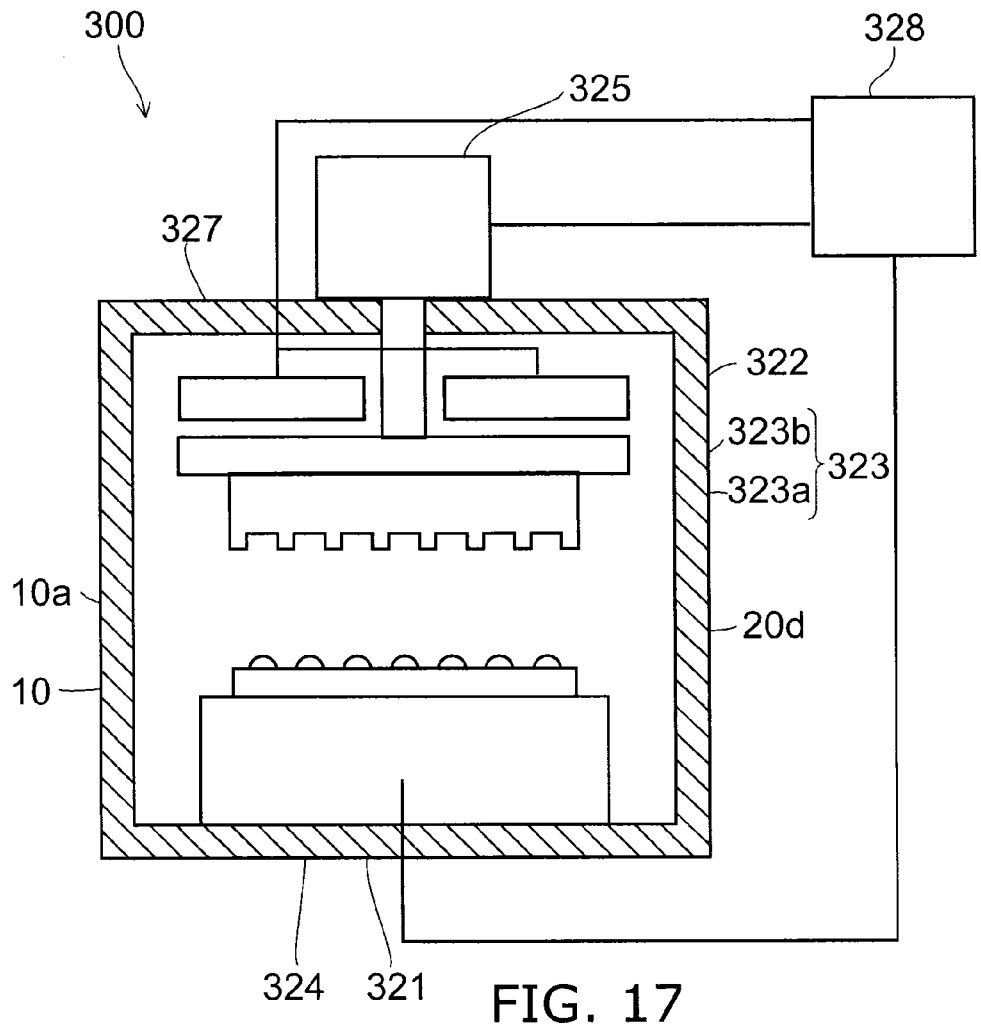
FIG. 17 is a schematic view illustrating the pattern forming unit 300.

FIG. 17 is a schematic view illustrating the pattern forming unit 300.

As illustrated in FIG. 17, the pattern forming unit 300 is provided with a processing container 321, a holding unit 322, a template 323, a mounting unit 324, a moving unit 325, an irradiating unit 327 and a control unit 328.

Inside the processing container 321, the holding unit 322 and the mounting unit 324 are provided so as to oppose each other. Hence, when the base body 10 is held on a mounting face of the mounting unit 324, a pattern portion 323*a* of the template 323 held by the holding unit 322 and the plurality of droplets 20*d* provided on the face 10*a* for forming the base body 10 pattern are in opposition to each other.

The holding unit 322 holds the template 323. There are no particular limits on the holding method of the template 323. For example, the holding method may be a mechanical holding method, a holding method using electromagnetic or electrostatic force, or the like.

The template 323 includes a base portion 323*b* having a plate-like form, and, on a first major surface of the base portion 323*b*, the pattern portion 323*a* having recesses and protrusions. The template 323 is not limited to this format. For example, the template may be hard-molded or soft-molded, or may have a layer made of a soft material between the pattern portion 323*a* and the base portion 323*b*.

Note, however, that in the pattern forming unit 300, an ultraviolet (UV) imprint method is used and so the template 323 is formed from a material (such as quartz) that allows ultraviolet light to pass through.

In addition, when the template 323 is held by the holding unit 322, the template 323 may be deformed to a predetermined form. For example, a contact form for when the template contacts the droplets 20*d* may be intentionally formed.

The mounting unit 324 includes a holding unit such as an electrostatic chuck, not illustrated in the drawings, and holds the base body 10 mounted on the mounting face. Note that the holding unit is not limited to the examples described above, but can be varied as appropriate. For example, a mechanical chuck, a vacuum chuck or the like may be used. A moving unit not illustrated in the drawings may be provided and used to change the position of the mounting unit 324 in the horizontal plane. In this case, the position of the holding unit 322 may be allowed to change. Specifically, it is sufficient that the moving unit not illustrated in the drawings changes a relative position of the holding unit 322 and the mounting unit 324.

The moving unit 325 changes a position of the holding unit 322 relative to the mounting unit 324. With this configuration, the template 323 held by the holding unit 322 can be pressed onto the plurality of droplets 20*d* provided on the face 10*a* for forming the base body 10 pattern. The moving unit 325 may, for example, be powered by pneumatics, hydraulics or the like. Note, however, that the driving method of the moving unit 325 is not limited to the examples described above, and can be varied as appropriate.

In the pattern forming unit 300, a so-called ultraviolet (UV) imprint method is used and so the irradiating unit 327 for irradiating UV light is provided.

The control unit 328 controls the operation of the constituents provided in the pattern forming unit 300. For example, the control unit 328 controls the holding unit 322 to attach and release the template 323. The control unit 328 also controls the mounting unit 324 to attach and release the base body 10. The control unit 328 further controls the moving unit 325 to change the position of the holding unit 322 holding the template 323. The control unit 328 further controls the irradiating unit 327 to irradiate UV light.

Note also that the holding unit 322, the template 323, the mounting unit 324, the moving unit 325, and the irradiating unit 327 may be provided within the above-described processing container 211, the mounting unit 324 and the mounting unit 214 may be used in combination, and the control unit 328 and the element controlling unit 216*b* may be used in combination.

A pressing unit not illustrated in the drawings may be provided to press a face on a side opposite the pattern portion 323*a* of the template 323.

The pressing unit not illustrated in the drawings may be arranged to apply a pressure of fluid such as air or the like to the template 323.

When the pressing unit not illustrated in the drawings is provided, the template 323 can be intentionally deformed, and the template contact form 323 can therefore be selected and controlled.

For example, by pressing a face on a side opposite the pattern portion 323*a* of the template 323 and thereby causing the template 323 to protrude toward the base body 10 side, the template contact form 323 can be selected and controlled.

Next, the operations of the pattern forming unit 300 will be described.

First, the base body 10 is loaded into the processing container 321 via a loading and unloading window provided in the processing container 321 but not illustrated in the drawings, by a conveyor device not illustrated in the drawings, and mounted on the mounting face of the mounting unit 324. The mounted base body 10 is held by the holding unit provided in the mounting unit 324 but not illustrated in the drawings.

Next, the loading and unloading window not illustrated in the drawings is closed, and the template 323 is moved by the moving unit 325 toward the base body 10 mounted on the mounting face of the mounting unit 214. The droplets 20*d* pressed by the template 323 deform three dimensionally on the base body 10, thereby forming a transfer subject body to which the pattern of the template 323 on the base body 10 is transferred.

Next, the transfer subject body is cured by irradiating the transfer subject body with ultraviolet (UV) light from the irradiating unit 327 via the template 323.

Next, the template 323 is removed from the transfer subject body by the moving unit 325.

As a result, the pattern can be formed on the face 10*a* for forming the base body 10 pattern. Moreover, as illustrated in FIG. 15C, the residual film may be removed by implementing drying etching on the transfer subject body using a dry etching device.

Here, the droplet positioning device 200 according to this embodiment is used to dispose the plurality of droplets 20*d* on the face 10*a* for forming the base body 10 pattern. Hence, when forming a pattern using the pattern forming unit 300, the generation of unfilled portions in recesses of the pattern of the template 323 and the occurrence of inappropriate thickness measurements in the residual film can be suppressed. As a result, the pattern can be formed with high level of transfer accuracy.

Third Embodiment

Next, a droplet positioning program according to a third embodiment will be described.

In this embodiment, a wafer for a semiconductor, a glass substrate, or the like is, for example, used as the base body. For the plurality of droplets to be disposed on the face for forming the pattern, so-called resist drop bodies are, for example, used. As a material for the resist drop bodies, a light (UV light or the like) curing resin may be used.

The droplet positioning program according to the third embodiment instructs a computer to execute the above-described droplet positioning method.

The droplet positioning program according to this embodiment is, for example, stored in a storage unit provided in the calculating unit 216*a* but not illustrated in the drawings in order to dispose the plurality of droplets 20*d* on the face for forming the base body 10 pattern. The droplet positioning program is, for example, stored in the storage unit, not illustrated in the drawings, in the calculating unit 216*a* by supplying the program to the calculating unit 216*a* stored in a recording medium not illustrated in the drawings and then reading the program from the recording medium. Note also that the droplet positioning program may be stored in the storage unit, not illustrated in the drawings, in the calculating unit 216*a* via a local area network (LAN) of a manufacturing execution system (MES) or the like.

The storage unit, not illustrated in the drawings, in the calculating unit 216*a* stores, for example, a program that instructs a computer to execute procedures (1) to (8) below.

(1) Dividing the face 25 for forming the base body 10 pattern into a plurality of first regions 40, each having an area smaller than an area occupied by one droplet 20*d*, to determine an amount of the droplet 20*d* required in each first region;

(2) adding the amount of the droplet 20*d* in each first region 40 to determine a total amount of the droplet 20*d* required for the entire face 25 for forming the base body 10 pattern;

(3) dividing the total amount of the droplet 20*d* by the amount of the droplet 20*d* to determine a total number of the droplets 20*d* to be disposed on the face 25 for forming the base body 10 pattern;

(4) determining a provisional positioning of the droplets 20*d* on the face 25 for forming the base body 10 pattern based on the template contact form;

(5) assigning each of the first regions 40 to most proximate droplet 20*d* and grouping the first regions 40 assigned to the most proximate droplets 20*d* as the second regions 45 to redivide the face 25 for forming the base body 10 pattern using the second regions 45;

(6) dividing an amount of a single droplet 20*d* by the total amount of the droplets 20*d* required in each of the first regions 40 belonging to the second region 45 to determine an evaluation value for each second region 45;

(7) Fixing the positions of the droplets 20*d* if the distribution of the evaluation values on the face 25 for forming the base body 10 pattern is in the target range; and (8) instructing a computer to execute the following procedure until distribution of the evaluation values is in the target range if the distribution of the evaluation values on the face 25 for forming the base body 10 pattern is out of the target range. The procedure may include the steps of: determining repositioning of at least any of the droplets 20*d*;

assigning the first regions 40 to the most proximate droplet 20*d* and grouping the first regions 40 assigned to the most proximate droplets 20*d* as the second regions 45 to redivide the face 25 for forming the base body 10 pattern using the second regions 45;

dividing an amount of a single droplet 20*d* by the total amount of the droplets 20*d* required in each of the first regions 40 belonging to the second region 45 to determine an evaluation value for each second region 45; and displaying data relating to the fixed positions of the droplets 20*d* on a display device, and transmitting the data to an external device.

Note that while the droplet positioning program may be executed sequentially according to the above-described sequence, the program is not necessarily executed sequentially and may be executed in parallel or executed selectively.

The droplet positioning program may be processed by the calculating unit 216a alone or processed in a distributed manner by a plurality of calculating units not illustrated in the drawings.

The determination of the positioning of the droplet 20d described above is executed by executing the stored droplet positioning program.

Here, the above-described first input data to fourth input data, data such as the dimensions and area of the face 25 for forming the pattern, and other data may be inputted in an appropriate manner.

Fourth Embodiment

Next, a template pattern design method according to a fourth embodiment is described.

In this embodiment, a wafer for a semiconductor, a glass substrate, or the like is, for example, used as the base body. For the plurality of droplets to be disposed on the face for forming the pattern, so-called resist drop bodies are, for example, used. As a material for the resist drop bodies, a light (UV light or the like) curing resin may be used.

Figure 18:
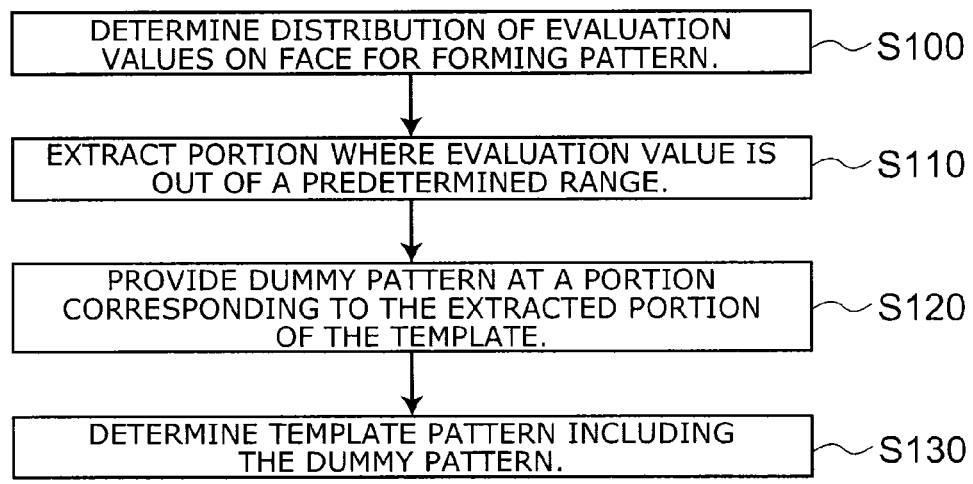
FIG. 18 is a flow chart illustrating the template pattern design method according to the fourth embodiment.

FIG. 18 is a flow chart illustrating the template pattern design method according to the fourth embodiment.

With the above-described droplet positioning method, the droplets 20d can be disposed at appropriate positions on the face 25 for forming the pattern.

Specifically, as illustrated in FIG. 13, by moving the droplets targeted for the positioning update little by little, not only the positional relationship of all the droplets, but also the distribution of the evaluation values on the face 25 for forming the pattern can be easily converged within the target range.

In certain cases, however, it may be necessary that the distribution of the evaluation values on the face 25 for forming the pattern is set to even closer to "1".

Thus, in the template pattern design method according to this embodiment, to bring the distribution of the evaluation values closer to "1", a dummy pattern is regionally provided and the template pattern is revised.

Although the dummy pattern is also transferred, the transferred dummy pattern can be selectively removed using a dry etching or similar processing. For example, the dummy pattern may be removed when removing the residual film as illustrated in FIG. 15C.

In the template pattern design method according to this embodiment, as illustrated in FIG. 18, the distribution of the evaluation values on the face for forming the pattern is determined first (Step S100). The distribution of the evaluation values on the face for forming the pattern may be determined using the above-described droplet positioning method.

For example, the distribution of the evaluation values may be determined by performing the above-described steps S10, S20, S30, S40, S50 and S60.

Note that detailed descriptions are omitted because the details that relate to method for determining the evaluation values can be similar to those described above.

Next, portions at which the evaluation values are not in the predetermined range are extracted (Step S110).

For example, portions at which the absolute value of the difference between the evaluation value and "1" is a predetermined value or greater are be extracted.

Next, a dummy pattern is provided at the portions corresponding to the extracted portions of the template (Step S120).

The dummy pattern form, size and the like can be appropriately selected from patterns determined in advance by a simulation, an experiment or the like.

Next, the template pattern including the dummy pattern is determined (Step S130).

With the template pattern design method according to this embodiment, a template pattern having a further improved transfer accuracy can be designed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A droplet positioning method for positioning a plurality of droplets on a face for forming a base body pattern, when transferring a pattern formed on a template, the method comprising:
dividing, by a controller, the face for forming the base body pattern into a plurality of first regions, each first region having an area smaller than an area occupied by one droplet, to determine an amount of the droplet required in each of the first region;
adding, by the controller, the amount of the droplet in each of the first regions to determine a total amount of droplets required for the entire face for forming the base body pattern;
dividing, by the controller, the total amount of droplets by the amount of one of the droplets to determine a total number of droplets to be disposed on the face for forming the base body pattern;
determining, by the controller, a provisional positioning of the droplets on the face for forming the base body pattern based on a template contact form, the template contact form being one of point contact, line contact and surface contact;
assigning, by the controller, each of the first regions to most proximate droplets, grouping the first regions assigned to the most proximate droplets as second regions, and redividing the face for forming the base body pattern again using the second regions;
dividing, by the controller, an amount of one of the droplets by the amount of the droplet required in each of the first regions belonging to the second region to determine an evaluation value for each second region,
fixing, by the controller, positions of all of the droplets if a distribution of the evaluation values for the face forming the base body pattern is in a target range; and
transferring, by an inkjet device including a plurality of nozzles, the droplets to the face to form the base body pattern according to the positions of all of the droplets that are fixed,
wherein if a distribution of the evaluation values for the face for forming the base body pattern is in a target range, positions of all the droplets are fixed, and if the distribution of the evaluation values for the face for forming the base body pattern is out of the target range, a repositioning of at least any of the droplets, the assigning each of the first regions to most proximate droplets and grouping the first regions assigned to the most proximate droplets as second regions, redividing the face for forming the base body pattern again using the second regions, and the dividing the amount of one of the droplets by the amount of the droplet required in each of the first regions belonging to the second region to determine an evaluation value for each second region are repeated until the distribution of the evaluation values is in the target range, and when the template contact form is point contact, disposing the droplets on concentric circular layers, centered on a contact point, when the template contact form is line contact, disposing the droplets on layers parallel to a contact line, and when the template contact form is surface contact, disposing the droplets on layers which have similar outlines to a contact surface.

2. The method according to claim 1, wherein, in the determining a provisional positioning of the droplets on the face for forming the base body pattern based on a template contact form, when the template contact form is point contact, the plurality of droplets is disposed at equal intervals on a plurality of concentric circular layers provided at equal intervals, centered on a contact point, a center-to-center distance of the plurality of droplets and the interval between the concentric circular layers are equal, and lines passing from the contact point, through centers of the droplets, and toward an outside of the face for forming the base body pattern do not overlap.

3. The method according to claim 1, wherein, in the determining a provisional positioning of the droplets on the face for forming the base body pattern based on a template contact form, when the template contact form is line contact, the plurality of droplets is disposed at equal intervals on a plurality of linear layers provided at equal intervals in parallel with a contact line, centered on the contact line, a center-to-center distance of the plurality of droplets and the interval between the linear layers are equal, and lines that are perpendicular to the linear layers, and pass from centers of the droplets toward an outside of the face for forming the base body pattern do not overlap.

4. The method according to claim 1, wherein, in the determining a provisional positioning of the droplets on the face for forming the base body pattern based on a template contact form, when the template contact form is surface contact, the plurality of droplets is disposed at equal intervals on a plurality of layers with similar outlines to a contact surface, the plurality of layers being provided at equal intervals, centered on the contact surface, a center-to-center distance of the plurality of droplets and the interval between the layers with similar outlines to the contact surface are equal, and lines passing from a centroid of the contact surface, through centers of the droplets, and toward an outside of the face for forming the base body pattern do not overlap.

5. The method according to claim 1, wherein, in the repositioning of at least any of the droplets, at least one other droplet most proximate to the droplet targeted for repositioning is selected, the evaluation value for the droplet targeted for repositioning and the evaluation value for the selected at least one other droplet are converted to weights, and a center of gravity is determined based on the weights resulting from conversion, a position of the selected at least one other droplet is fixed, and a position of the droplet targeted for repositioning is determined such that the center of gravity of the weights is set to be a centroid, and the droplet targeted for repositioning is moved toward the determined position of the droplet targeted for repositioning.

6. The method according to claim 1, wherein, in the adding the amount of the droplet in each of the first regions to determine a total amount of the droplets required for the entire face for forming the base body pattern, the total amount of the droplets is determined based on the amount of the droplet determined from data relating to pattern dimensions extracted from design data of the pattern, and data relating to a density distribution of the pattern or a coverage factor distribution of the pattern extracted from the design data of the pattern, and a correction value for the amount of the droplet determined from at least any of data relating to in-face correction of the amount of the droplet on the face for forming the base body pattern, and data relating to correction of the amount of the droplet due to a dispensing device.

7. A pattern forming method comprising:

positioning a plurality of droplets on a face for forming a base body pattern using the droplet positioning method according to claim 1; and pressing a template with recesses and protrusions formed thereon onto the disposed plurality of droplets to form a pattern of the droplets on the face for forming the base body pattern.

8. The method according to claim 7, wherein, in the positioning of a plurality of droplets on a face for forming a base body pattern, when determining a provisional positioning of the droplets on the face for forming the base body pattern based on a template contact form, if the template contact form is point contact, the plurality of droplets is disposed at equal intervals on a plurality of concentric circular layers provided at equal intervals, centered on a contact point, a center-to-center distance of the plurality of droplets and the interval between the concentric circular layers are equal, and lines passing from the contact point, through centers of the droplets, and toward an outside of the face for forming the base body pattern do not overlap.

9. The method according to claim 7, wherein, in the positioning of a plurality of droplets on a face for forming a base body pattern, when determining a provisional positioning of the droplets on the face for forming the base body pattern based on a template contact form, if the template contact form is line contact, the plurality of droplets is disposed at equal intervals on a plurality of linear layers provided at equal intervals in parallel with a contact line, centered on the contact line, a center-to-center distance of the plurality of droplets and the interval between the linear layers are equal, and lines that are perpendicular to the linear layers and pass from centers of the droplets towards an outside of the face for forming the base body pattern do not overlap.

10. The method according to claim 7, wherein, in the positioning of a plurality of droplets on a face for forming a base body pattern, when determining a provisional positioning of the droplets on the face for forming the base body pattern based on a template contact form, if the template contact form is surface contact, the plurality of droplets is disposed at equal intervals on a plurality of layers with similar outlines to a contact surface, the plurality of layers being provided at equal intervals, centered on the contact surface, a center-to-center distance of the plurality of droplets and the interval between the layers with similar outlines to the contact surface are equal, and lines passing from a centroid of the contact surface, through centers of the droplets, and toward an outside of the face for forming the base body pattern do not overlap.

11. The method according to claim 7, wherein, in the positioning of a plurality of droplets on a face for forming a base body pattern, when repositioning at least any of the droplets, at least one other droplet most proximate to the droplet targeted for repositioning is selected, the evaluation value for the droplet targeted for repositioning and the evaluation value for the selected at least one other droplet are converted to weights, and a center of gravity is determined based on the weights resulting from conversion, a position of the selected at least one other droplet is fixed, and a position of the droplet targeted for repositioning is determined such that the center of gravity of the weights is set to be a centroid, and the droplet targeted for repositioning is moved toward the determined position of the droplet targeted for repositioning.

12. The method according to claim 7, wherein, in the positioning of a plurality of droplets on a face for forming a base body pattern, when adding the amount of the droplet in each of the first region to determine a total amount of the droplets required for the entire face for forming the base body pattern, the total amount of the droplets is determined based on the amount of the droplet determined from data relating to pattern dimensions extracted from design data of the pattern, and data relating to a density distribution of the pattern or a coverage factor distribution of the pattern extracted from the design data of the pattern, and a correction value for the amount of the droplet determined from at least any of data relating to in-face correction of the amount of the droplet on the face for forming the base body pattern, and data relating to correction of the amount of the droplet due to a dispensing device.

13. A template pattern design method comprising:

dividing, by a controller, a face for forming a base body pattern into a plurality of first regions, each first region having an area smaller than an area occupied by one droplet, to determine an amount of the droplet required in each of the first regions;

adding, by the controller, the amount of the droplet in each of the first regions to determine a total amount of the droplets required for the entire face for forming the base body pattern;

dividing, by the controller, the total amount of the droplets by the amount of one of the droplets to determine a total number of the droplets to be disposed on the face for forming the base body pattern;

determining, by the controller, a provisional positioning of the droplets on the face for forming the base body pattern based on a template contact form, the template contact form being one of point contact, line contact and surface contact;

dividing, by the controller, the face for forming the base body pattern again using second regions by assigning each of the first regions to most proximate droplets and grouping the first regions assigned to the most proximate droplets as the second regions;

determining, by the controller, an evaluation value for each second region by dividing an amount of one of the droplets by the amount of the droplet required in each of the first regions belonging to the second region; and revising, by the controller, the pattern of the template according to the evaluation value;

fixing, by the controller positions of the droplets in the pattern; and transferring, by an inkjet device including a plurality of nozzles, the droplets to the face to form the base body pattern according to the positions of all of the droplets that are fixed, wherein when the template contact form is point contact the droplets are disposed on concentric circular layers, centered on a contact point, when the template contact form is line contact, the droplets are disposed on layers parallel to a contact line, and when the template contact form is surface contact, the droplets are disposed on layers which have similar outlines to a contact surface.

* * * * *